(12) United States Patent  (10) Patent No.: US 7,797,855 B2
Fukuoka et al.  (45) Date of Patent: Sep. 21, 2010

(54) HEATING APPARATUS, AND COATING AND DEVELOPING APPARATUS

(75) Inventors: Tetsuo Fukuoka, Koshi (JP); Masami Akimoto, Koshi (JP); Takahiro Kitano, Koshi (JP); Yoshio Kimura, Koshi (JP); Shinichi Hayashi, Koshi (JP); Hikaru Ito, Minato-Ku (JP)

(73) Assignee: Tokyo Electron Limited, Tokyo-To (JP)

( * ) Notice: Subject to any disclaimer, the term of this patent is extended or adjusted under 35 U.S.C. 154(b) by 870 days.

(21) Appl. No.: 11/505,810

(22) Filed: Aug. 18, 2006

(65) Prior Publication Data
US 2007/0048979 A1 Mar. 1, 2007

(30) Foreign Application Priority Data
Aug. 31, 2005 (JP) ............................. 2005-251389

(51) Int. Cl.
F26B 21/06 (2006.01)
(52) U.S. Cl. ............................. 34/78; 34/552; 34/618; 34/62; 34/72; 34/80; 414/217; 414/217.1; 204/199; 118/709
(58) Field of Classification Search .................. 34/552, 34/618, 72, 78, 80, 218, 210, 90, 99; 427/372.2, 427/314; 204/199; 118/719; 414/217.1, 414/217
See application file for complete search history.

(56) References Cited

U.S. PATENT DOCUMENTS

| 3,026,628 | A | * | 3/1962 | Berger, Sr. et al. | 34/231 |
| 3,609,876 | A | * | 10/1971 | Bachrach et al. | 34/418 |
| 3,647,353 | A | * | 3/1972 | Calzaferri et al. | 8/186 |
| 3,686,822 | A | * | 8/1972 | Wolfelsperger | 53/427 |
| 3,710,450 | A | * | 1/1973 | Figiel | 34/337 |
| 3,919,379 | A | * | 11/1975 | Smarook | 264/164 |
| 4,079,522 | A | * | 3/1978 | Ham | 34/247 |
| 4,330,946 | A | * | 5/1982 | Courneya | 34/263 |
| 4,338,730 | A | * | 7/1982 | Tatsumi et al. | 34/569 |
| 4,694,779 | A | * | 9/1987 | Hammond et al. | 118/730 |
| 4,735,001 | A | * | 4/1988 | Mishina et al. | 34/73 |

(Continued)

FOREIGN PATENT DOCUMENTS

JP 62-17133 2/1987

(Continued)

*Primary Examiner*—Stephen M. Gravini
(74) *Attorney, Agent, or Firm*—Oblon, Spivak, McClelland, Maier & Neustadt, L.L.P.

(57) ABSTRACT

A heating apparatus 2 comprises a housing 20; a flat heating chamber 4 which is provided in the housing 2 and adapted to heat a wafer W used as a substrate, with one side of the heating chamber 4 opening for carrying in and carrying out the wafer; and a heating plates 44, 45 provided in the heating chamber 4 such that the wafer W can be heated from both above and below. A cooling plate 3 is provided in the housing 20 located in the vicinity of the opening of the heating chamber 4, for cooling the wafer W after being heated by the heating plates 44, 45. Additionally, a carrying means is provided in the housing 20 for carrying the wafer W between an upper position of the cooling plate 3 and the interior of the heating chamber 4 such that a heat treatment for the wafer W can be performed with the wafer W being held in the heating chamber 4.

8 Claims, 16 Drawing Sheets

U.S. PATENT DOCUMENTS

| | | | |
|---|---|---|---|
| 4,785,552 A * | 11/1988 | Best | 34/418 |
| 4,800,251 A * | 1/1989 | Matsuoka | 219/121.43 |
| 4,841,645 A * | 6/1989 | Bettcher et al. | 34/78 |
| 4,957,432 A * | 9/1990 | Rachal et al. | 432/59 |
| 4,977,688 A * | 12/1990 | Roberson et al. | 34/92 |
| 5,047,135 A * | 9/1991 | Nieman | 204/619 |
| 5,052,126 A * | 10/1991 | Moe et al. | 34/78 |
| 5,072,526 A * | 12/1991 | Hirota et al. | 34/60 |
| 5,099,586 A * | 3/1992 | Anderson | 34/68 |
| 5,105,556 A * | 4/1992 | Kurokawa et al. | 34/470 |
| 5,115,576 A * | 5/1992 | Roberson et al. | 34/402 |
| 5,226,242 A * | 7/1993 | Schwenkler | 34/78 |
| 5,243,768 A * | 9/1993 | Fukao et al. | 34/443 |
| 5,267,455 A * | 12/1993 | Dewees et al. | 68/5 C |
| 5,315,766 A * | 5/1994 | Roberson et al. | 34/409 |
| 5,321,896 A * | 6/1994 | Brownewell et al. | 34/247 |
| 5,325,601 A * | 7/1994 | Brownewell et al. | 34/247 |
| 5,326,543 A * | 7/1994 | Fiorenzano, Jr. | 422/292 |
| 5,361,515 A * | 11/1994 | Peremyschev | 34/393 |
| 5,369,891 A * | 12/1994 | Kamikawa | 34/78 |
| 5,371,950 A * | 12/1994 | Schumacher | 34/78 |
| 5,412,958 A * | 5/1995 | Iliff et al. | 68/5 C |
| 5,443,540 A * | 8/1995 | Kamikawa | 34/471 |
| 5,518,542 A * | 5/1996 | Matsukawa et al. | 118/52 |
| 5,565,034 A * | 10/1996 | Nanbu et al. | 118/668 |
| 5,575,079 A * | 11/1996 | Yokomizo et al. | 34/78 |
| 5,596,912 A * | 1/1997 | Laurence et al. | 76/107.1 |
| 5,604,990 A * | 2/1997 | Takekoshi | 34/68 |
| 5,608,974 A * | 3/1997 | Tanaka et al. | 34/78 |
| 5,620,560 A * | 4/1997 | Akimoto et al. | 216/41 |
| 5,671,544 A * | 9/1997 | Yokomizo et al. | 34/78 |
| 5,686,143 A * | 11/1997 | Matsukawa et al. | 427/271 |
| 5,725,664 A * | 3/1998 | Nanbu et al. | 118/52 |
| 5,731,157 A * | 3/1998 | Miller et al. | 435/7.4 |
| 5,752,532 A * | 5/1998 | Schwenkler | 134/102.3 |
| 5,780,295 A * | 7/1998 | Livesey et al. | 435/307.1 |
| 5,797,195 A * | 8/1998 | Huling et al. | 34/404 |
| 5,862,605 A * | 1/1999 | Horie et al. | 34/68 |
| 5,908,292 A * | 6/1999 | Smith et al. | 432/197 |
| 5,937,535 A * | 8/1999 | Hoffman et al. | 34/78 |
| 5,940,985 A * | 8/1999 | Kamikawa et al. | 34/471 |
| 5,943,880 A * | 8/1999 | Tateyama | 62/434 |
| 5,950,328 A * | 9/1999 | Ichiko et al. | 34/364 |
| 5,953,828 A * | 9/1999 | Hillman | 34/74 |
| 5,954,911 A * | 9/1999 | Bergman et al. | 156/345.29 |
| 5,964,954 A * | 10/1999 | Matsukawa et al. | 134/6 |
| 6,014,817 A * | 1/2000 | Thompson et al. | 34/60 |
| 6,026,588 A * | 2/2000 | Clark et al. | 34/77 |
| 6,051,101 A * | 4/2000 | Ohtani et al. | 156/345.32 |
| 6,054,181 A * | 4/2000 | Nanbu et al. | 427/240 |
| 6,067,728 A * | 5/2000 | Farmer et al. | 34/470 |
| 6,095,083 A * | 8/2000 | Rice et al. | 118/723 I |
| 6,108,932 A * | 8/2000 | Chai | 34/245 |
| 6,128,830 A * | 10/2000 | Bettcher et al. | 34/404 |
| 6,134,807 A * | 10/2000 | Komino et al. | 34/418 |
| 6,143,078 A * | 11/2000 | Ishikawa et al. | 118/715 |
| 6,161,300 A * | 12/2000 | Kim | 34/73 |
| 6,170,169 B1 * | 1/2001 | Weber et al. | 34/276 |
| 6,185,839 B1 * | 2/2001 | Kholodenko et al. | 34/255 |
| 6,213,704 B1 * | 4/2001 | White et al. | 414/217 |
| 6,231,732 B1 * | 5/2001 | Hollars et al. | 204/298.26 |
| 6,250,374 B1 * | 6/2001 | Fujino et al. | 165/80.1 |
| 6,276,072 B1 * | 8/2001 | Morad et al. | 34/428 |
| 6,277,442 B1 * | 8/2001 | Beaumont et al. | 427/96.9 |
| 6,300,600 B1 * | 10/2001 | Ratliff et al. | 219/390 |
| 6,312,319 B1 * | 11/2001 | Donohue et al. | 451/56 |
| 6,332,751 B1 * | 12/2001 | Kozawa et al. | 414/816 |
| 6,334,266 B1 * | 1/2002 | Moritz et al. | 34/337 |
| 6,344,084 B1 * | 2/2002 | Koinuma et al. | 117/201 |
| 6,370,796 B1 * | 4/2002 | Zucker | 34/428 |
| 6,381,870 B1 * | 5/2002 | Kohlman et al. | 34/311 |
| 6,391,251 B1 * | 5/2002 | Keicher et al. | 419/7 |
| 6,401,359 B1 * | 6/2002 | Amano | 34/402 |
| 6,403,491 B1 * | 6/2002 | Liu et al. | 438/710 |
| 6,451,240 B1 * | 9/2002 | Sherman et al. | 264/504 |
| 6,451,515 B2 * | 9/2002 | Takamori et al. | 430/330 |
| 6,462,310 B1 * | 10/2002 | Ratliff et al. | 219/390 |
| 6,474,986 B2 * | 11/2002 | Oda et al. | 432/247 |
| 6,483,081 B1 * | 11/2002 | Batchelder | 219/390 |
| 6,486,081 B1 * | 11/2002 | Ishikawa et al. | 438/788 |
| 6,517,303 B1 * | 2/2003 | White et al. | 414/217 |
| 6,531,212 B2 * | 3/2003 | Owusu et al. | 428/323 |
| 6,531,214 B2 * | 3/2003 | Carter et al. | 428/336 |
| 6,540,865 B1 * | 4/2003 | Miekka et al. | 156/249 |
| 6,550,988 B2 * | 4/2003 | Sugimoto et al. | 396/564 |
| 6,559,070 B1 * | 5/2003 | Mandal | 438/781 |
| 6,560,896 B2 * | 5/2003 | Granneman et al. | 34/391 |
| 6,565,532 B1 * | 5/2003 | Yuzhakov et al. | 604/142 |
| 6,565,815 B1 * | 5/2003 | Chang et al. | 422/198 |
| 6,602,349 B2 * | 8/2003 | Chandra et al. | 134/19 |
| 6,652,478 B1 * | 11/2003 | Gartstein et al. | 604/22 |
| 6,653,212 B1 * | 11/2003 | Yamanaka et al. | 438/485 |
| 6,658,764 B2 * | 12/2003 | Hsu | 34/468 |
| 6,660,422 B2 * | 12/2003 | Krasij et al. | 429/35 |
| 6,701,637 B2 * | 3/2004 | Lindsay et al. | 34/71 |
| 6,716,302 B2 * | 4/2004 | Carducci et al. | 156/345.47 |
| 6,716,629 B2 * | 4/2004 | Hess et al. | 435/420 |
| 6,740,853 B1 * | 5/2004 | Johnson et al. | 219/444.1 |
| 6,746,198 B2 * | 6/2004 | White et al. | 414/222.13 |
| 6,749,655 B2 * | 6/2004 | Dautenhahn | 55/385.1 |
| 6,790,763 B2 * | 9/2004 | Kondo et al. | 438/622 |
| 6,797,639 B2 * | 9/2004 | Carducci et al. | 438/710 |
| 6,811,744 B2 * | 11/2004 | Keicher et al. | 419/5 |
| 6,828,225 B2 * | 12/2004 | Kondo et al. | 438/622 |
| 6,844,528 B2 * | 1/2005 | Ratliff et al. | 219/390 |
| 6,857,200 B1 * | 2/2005 | Tousimis et al. | 34/201 |
| 6,861,373 B2 * | 3/2005 | Aoki et al. | 438/761 |
| 6,875,283 B2 * | 4/2005 | Nishibayashi | 118/725 |
| 6,900,413 B2 * | 5/2005 | Ratliff et al. | 219/390 |
| 6,905,548 B2 * | 6/2005 | Jurgensen et al. | 118/715 |
| 6,908,512 B2 * | 6/2005 | Ivanov et al. | 118/503 |
| 6,921,466 B2 * | 7/2005 | Hongo et al. | 204/198 |
| 6,928,748 B2 * | 8/2005 | Chen et al. | 34/445 |
| 6,931,277 B1 * | 8/2005 | Yuzhakov et al. | 604/21 |
| 6,949,143 B1 * | 9/2005 | Kurita et al. | 118/719 |
| 7,051,671 B2 * | 5/2006 | Aoki et al. | 118/723 E |
| 7,060,618 B2 * | 6/2006 | Inoue et al. | 438/687 |
| 7,074,298 B2 * | 7/2006 | Gondhalekar et al. | 156/345.48 |
| 7,090,743 B2 * | 8/2006 | Colson et al. | 156/583.5 |
| 7,105,282 B2 * | 9/2006 | Yamane et al. | 430/350 |
| 7,107,999 B2 * | 9/2006 | Sasaki | 134/66 |
| 7,141,274 B2 * | 11/2006 | Wang et al. | 427/430.1 |
| 7,146,744 B2 * | 12/2006 | Kobayashi | 34/62 |
| 7,147,718 B2 * | 12/2006 | Jurgensen et al. | 118/715 |
| 7,166,204 B2 * | 1/2007 | Sendai et al. | 205/143 |
| 7,172,979 B2 * | 2/2007 | Hongo et al. | 438/782 |
| 7,191,033 B2 * | 3/2007 | Higashi et al. | 700/213 |
| 7,210,864 B2 * | 5/2007 | Higashi et | 396/611 |
| 7,217,944 B2 * | 5/2007 | Kashiwaya et al. | 250/580 |
| 7,220,365 B2 * | 5/2007 | Qu et al. | 252/70 |
| 7,223,690 B2 * | 5/2007 | Kondo et al. | 438/637 |
| 7,241,061 B2 * | 7/2007 | Akimoto et al. | 396/611 |
| 7,255,833 B2 * | 8/2007 | Chang et al. | 422/58 |
| 7,267,933 B2 * | 9/2007 | Oyamada et al. | 430/350 |
| 7,279,408 B2 * | 10/2007 | Inoue et al. | 438/597 |
| 7,281,869 B2 * | 10/2007 | Akimoto et al. | 396/611 |
| 7,284,439 B2 * | 10/2007 | Jonsson | 73/724 |
| 7,287,920 B2 * | 10/2007 | Hayashi et al. | 396/611 |
| 7,332,198 B2 * | 2/2008 | Wang et al. | 427/430.1 |
| 7,343,699 B2 * | 3/2008 | Svonja | 34/467 |
| 7,354,501 B2 * | 4/2008 | Gondhalekar et al. | 156/345.48 |
| 7,379,785 B2 * | 5/2008 | Higashi et al. | 700/112 |
| 7,399,681 B2 * | 7/2008 | Couillard et al. | 438/458 |
| 7,403,260 B2 * | 7/2008 | Matsuoka et al. | 355/27 |

| | | | | | | | |
|---|---|---|---|---|---|---|---|
| 7,416,541 B2* | 8/2008 | Yuzhakov et al. | 604/272 | 2004/0232415 A1* | 11/2004 | Aoki et al. | 257/53 |
| 7,418,970 B2* | 9/2008 | Sugimoto et al. | 134/105 | 2004/0234696 A1* | 11/2004 | Hongo et al. | 427/328 |
| 7,420,650 B2* | 9/2008 | Tanaka et al. | 355/30 | 2004/0237896 A1* | 12/2004 | Hongo | 118/719 |
| 7,437,834 B2* | 10/2008 | Nakatsukasa et al. | 34/381 | 2004/0261817 A1* | 12/2004 | Araki et al. | 134/2 |
| 7,474,377 B2* | 1/2009 | Matsuoka et al. | 355/27 | 2005/0003675 A1* | 1/2005 | Carducci et al. | 438/710 |
| 7,479,213 B2* | 1/2009 | Nagai et al. | 205/170 | 2005/0016454 A1* | 1/2005 | Kurita et al. | 118/719 |
| 7,501,155 B2* | 3/2009 | Lamotte et al. | 427/255.5 | 2005/0023149 A1* | 2/2005 | Nakada et al. | 205/137 |
| 7,503,710 B2* | 3/2009 | Kiyota | 396/611 | 2005/0051437 A1* | 3/2005 | Kurashina et al. | 205/143 |
| 7,520,936 B2* | 4/2009 | Nagashima et al. | 118/666 | 2005/0064703 A1* | 3/2005 | Kondo et al. | 438/633 |
| 7,530,749 B2* | 5/2009 | Yamamoto et al. | 396/611 | 2005/0067113 A1* | 3/2005 | Colson et al. | 156/580 |
| 7,534,627 B2* | 5/2009 | Michaelson et al. | 438/5 | 2005/0087441 A1* | 4/2005 | Hongo et al. | 204/297.06 |
| 7,597,492 B2* | 10/2009 | Hayashida et al. | 396/611 | 2005/0101156 A1* | 5/2005 | Nishibayashi | 438/778 |
| 7,615,970 B1* | 11/2009 | Gimlan | 320/166 | 2005/0133527 A1* | 6/2005 | Dullea et al. | 222/1 |
| 7,624,772 B2* | 12/2009 | Iwabuchi | 141/82 | 2005/0139482 A1* | 6/2005 | Nagai et al. | 205/170 |
| 7,641,434 B2* | 1/2010 | Kurita et al. | 414/217 | 2005/0197729 A1* | 9/2005 | Higashi et al. | 700/112 |
| 7,654,221 B2* | 2/2010 | Lubomirsky et al. | 118/52 | 2005/0209565 A1* | 9/2005 | Yuzhakov et al. | 604/173 |
| 7,655,933 B2* | 2/2010 | England et al. | 250/492.21 | 2005/0210702 A1* | 9/2005 | Svonja | 34/467 |
| 7,661,894 B2* | 2/2010 | Matsuoka et al. | 396/611 | 2005/0217581 A1* | 10/2005 | Higashi et al. | 118/719 |
| 2001/0024609 A1* | 9/2001 | White et al. | 414/217 | 2005/0255670 A1* | 11/2005 | Couillard et al. | 438/455 |
| 2001/0024691 A1* | 9/2001 | Kimura et al. | 427/346 | 2005/0260345 A1* | 11/2005 | Lubomirsky et al. | 427/240 |
| 2001/0038988 A1* | 11/2001 | Oda et al. | 432/5 | 2005/0287821 A1* | 12/2005 | Higashi et al. | 438/780 |
| 2001/0049070 A1* | 12/2001 | Takamori et al. | 430/270.1 | 2006/0004306 A1* | 1/2006 | Altshuler et al. | 601/3 |
| 2001/0055708 A1* | 12/2001 | Krasij et al. | 429/32 | 2006/0004347 A1* | 1/2006 | Altshuler et al. | 606/4 |
| 2002/0006876 A1* | 1/2002 | Hongo et al. | 505/191 | 2006/0011133 A1* | 1/2006 | Nishibayashi | 118/630 |
| 2002/0014257 A1* | 2/2002 | Chandra et al. | 134/19 | 2006/0011296 A1* | 1/2006 | Higashi et al. | 156/345.31 |
| 2002/0051644 A1* | 5/2002 | Sugimoto et al. | 396/564 | 2006/0020309 A1* | 1/2006 | Altshuler et al. | 607/88 |
| 2002/0094533 A1* | 7/2002 | Hess et al. | 435/6 | 2006/0028531 A1* | 2/2006 | Magee et al. | 347/223 |
| 2002/0116836 A1* | 8/2002 | Morad et al. | 34/62 | 2006/0040487 A1* | 2/2006 | Inoue et al. | 438/597 |
| 2002/0148135 A1* | 10/2002 | Kawase | 34/72 | 2006/0058712 A1* | 3/2006 | Altshuler et al. | 601/15 |
| 2002/0155276 A1* | 10/2002 | Owusu et al. | 428/323 | 2006/0086616 A1* | 4/2006 | Kurashina et al. | 205/83 |
| 2002/0155283 A1* | 10/2002 | Carter et al. | 428/343 | 2006/0113192 A1* | 6/2006 | Kurashina et al. | 205/83 |
| 2002/0187423 A1* | 12/2002 | Takamori et al. | 430/270.1 | 2006/0162180 A1* | 7/2006 | Heilman et al. | 34/389 |
| 2003/0000840 A1* | 1/2003 | Kimura et al. | 205/81 | 2006/0162858 A1* | 7/2006 | Akimoto et al. | 156/272.8 |
| 2003/0024920 A1* | 2/2003 | Ratliff et al. | 219/390 | 2006/0165409 A1* | 7/2006 | Akimoto et al. | 396/611 |
| 2003/0037880 A1* | 2/2003 | Carducci et al. | 156/345.43 | 2006/0191478 A1* | 8/2006 | Gondhalekar et al. | 118/715 |
| 2003/0038111 A1* | 2/2003 | Carducci et al. | 216/59 | 2006/0194445 A1* | 8/2006 | Hayashi et al. | 438/758 |
| 2003/0049558 A1* | 3/2003 | Aoki et al. | 430/128 | 2006/0198633 A1* | 9/2006 | Tanaka et al. | 396/611 |
| 2003/0057098 A1* | 3/2003 | Sendai et al. | 205/143 | 2006/0201615 A1* | 9/2006 | Matsuoka et al. | 156/272.2 |
| 2003/0066638 A1* | 4/2003 | Qu et al. | 165/186 | 2006/0201616 A1* | 9/2006 | Matsuoka et al. | 156/272.2 |
| 2003/0075808 A1* | 4/2003 | Inoue et al. | 257/774 | 2006/0231027 A1* | 10/2006 | Iwabuchi | 118/719 |
| 2003/0089608 A1* | 5/2003 | Kumekawa | 204/471 | 2006/0234508 A1* | 10/2006 | Shirakashi et al. | 438/691 |
| 2003/0089698 A1* | 5/2003 | Ratliff et al. | 219/390 | 2006/0245852 A1* | 11/2006 | Iwabuchi | 414/217 |
| 2003/0092261 A1* | 5/2003 | Kondo et al. | 438/638 | 2006/0266290 A1* | 11/2006 | Kiyota | 118/719 |
| 2003/0101612 A1* | 6/2003 | Granneman et al. | 34/72 | 2006/0272174 A1* | 12/2006 | Hartig | 34/475 |
| 2003/0124716 A1* | 7/2003 | Hess et al. | 435/287.1 | 2007/0017560 A1* | 1/2007 | Kiyota | 134/137 |
| 2003/0131495 A1* | 7/2003 | Morad et al. | 34/412 | 2007/0020918 A1* | 1/2007 | Hirokawa et al. | 438/626 |
| 2003/0152492 A1* | 8/2003 | Chang et al. | 422/99 | 2007/0048979 A1* | 3/2007 | Fukuoka et al. | 438/490 |
| 2003/0164181 A1* | 9/2003 | Ohtani | 134/62 | 2007/0071581 A1* | 3/2007 | Gilchrist et al. | 414/217 |
| 2003/0168346 A1* | 9/2003 | Hey et al. | 205/157 | 2007/0086881 A1* | 4/2007 | Kurita et al. | 414/805 |
| 2003/0180807 A1* | 9/2003 | Hess et al. | 435/7.1 | 2007/0089673 A1* | 4/2007 | Matsuoka et al. | 118/666 |
| 2003/0190220 A1* | 10/2003 | White et al. | 414/217 | 2007/0111519 A1* | 5/2007 | Lubomirsky et al. | 438/678 |
| 2003/0192136 A1* | 10/2003 | Magee et al. | 8/500 | 2007/0113977 A1* | 5/2007 | Hongo et al. | 156/345.31 |
| 2003/0198773 A1* | 10/2003 | Miekka et al. | 428/41.8 | 2007/0122551 A1* | 5/2007 | Yamamoto et al. | 427/240 |
| 2003/0206256 A1* | 11/2003 | Drain et al. | 349/113 | 2007/0160947 A1* | 7/2007 | Akimoto et al. | 432/77 |
| 2003/0206820 A1* | 11/2003 | Keicher et al. | 419/9 | 2007/0177869 A1* | 8/2007 | Yamamoto et al. | 396/611 |
| 2003/0213434 A1* | 11/2003 | Gondhalekar et al. | 118/724 | 2007/0193056 A1* | 8/2007 | Switalski | 34/88 |
| 2003/0213562 A1* | 11/2003 | Gondhalekar et al. | 156/345.48 | 2007/0194005 A1* | 8/2007 | Hirakawa et al. | 219/403 |
| 2003/0215573 A1* | 11/2003 | Nishibayashi | 427/379 | 2007/0207014 A1* | 9/2007 | Toshima | 414/217 |
| 2003/0221771 A1* | 12/2003 | Chang et al. | 156/242 | 2007/0209226 A1* | 9/2007 | Coon | 34/403 |
| 2004/0003831 A1* | 1/2004 | Mount | 134/26 | 2007/0249098 A1* | 10/2007 | Cady et al. | 438/119 |
| 2004/0020601 A1* | 2/2004 | Zhao et al. | 156/345.32 | 2007/0275178 A1* | 11/2007 | Nishi et al. | 427/430.1 |
| 2004/0022940 A1* | 2/2004 | Nagai et al. | 427/230 | 2008/0011228 A1* | 1/2008 | Inoue et al. | 118/400 |
| 2004/0038156 A1* | 2/2004 | Oyamada et al. | 430/350 | 2008/0025823 A1* | 1/2008 | Harumoto | 414/217.1 |
| 2004/0055177 A1* | 3/2004 | Tsuji et al. | 34/618 | 2008/0032426 A1* | 2/2008 | Michaelson et al. | 438/7 |
| 2004/0058281 A1* | 3/2004 | Yamane et al. | 430/350 | 2008/0042078 A1* | 2/2008 | England et al. | 250/492.21 |
| 2004/0154931 A1* | 8/2004 | Hongo et al. | 205/676 | 2008/0044257 A1* | 2/2008 | England et al. | 414/217.1 |
| 2004/0161548 A1* | 8/2004 | Nagashima et al. | 427/558 | 2008/0044566 A1* | 2/2008 | Miekka et al. | 427/208.4 |
| 2004/0163683 A1* | 8/2004 | Sugimoto et al. | 134/56 R | 2008/0057573 A1* | 3/2008 | Hutchins et al. | 435/307.1 |
| 2004/0171269 A1* | 9/2004 | Kondo et al. | 438/694 | 2008/0081351 A1* | 4/2008 | Hutchins et al. | 435/30 |
| 2004/0197485 A1* | 10/2004 | Wang et al. | 427/437 | 2008/0081363 A1* | 4/2008 | Hutchins et al. | 435/286.4 |
| 2004/0219289 A1* | 11/2004 | Lamotte et al. | 427/69 | 2008/0127508 A1* | 6/2008 | Ohno et al. | 34/552 |
| 2004/0231794 A1* | 11/2004 | Hongo et al. | 156/345.12 | 2008/0129968 A1* | 6/2008 | Hayashida et al. | 355/27 |
| 2004/0231997 A1* | 11/2004 | Wang et al. | 205/143 | 2008/0135207 A1* | 6/2008 | Fukuoka et al. | 165/65 |

| | | | | | | |
|---|---|---|---|---|---|---|
| 2008/0142367 A1* | 6/2008 | Von Gutfeld et al. ............ 205/92 | 2009/0120584 A1* | 5/2009 | Lubomirsky et al. ... 156/345.51 |
| 2008/0169279 A1* | 7/2008 | Fukuoka et al. ............... 219/405 | 2009/0149982 A1* | 6/2009 | Higashi et al. ............... 700/110 |
| 2008/0172047 A1* | 7/2008 | Altshuler et al. ................. 606/9 | 2009/0179366 A1* | 7/2009 | Herchen et al. ................ 269/21 |
| 2008/0182217 A1* | 7/2008 | Fukuoka et al. ................. 432/1 | 2009/0208879 A1* | 8/2009 | Yamada et al. ............... 430/322 |
| 2008/0183162 A1* | 7/2008 | Altshuler et al. ................. 606/9 | 2009/0275149 A1* | 11/2009 | Michaelson et al. ............. 438/5 |
| 2008/0185370 A1* | 8/2008 | Fukuoka et al. ............... 219/385 | 2010/0003904 A1* | 1/2010 | Duescher .................... 451/259 |
| 2008/0212049 A1* | 9/2008 | Fukutomi et al. ............... 355/30 | 2010/0040437 A1* | 2/2010 | Iwabuchi .................... 414/217 |
| 2008/0212643 A1* | 9/2008 | McGahhey et al. .......... 374/152 | | | |
| 2008/0214988 A1* | 9/2008 | Altshuler et al. ............... 604/21 | | | |
| 2008/0254532 A1* | 10/2008 | Chang et al. .............. 435/288.7 | | | |
| 2008/0306471 A1* | 12/2008 | Altshuler et al. ............... 606/10 | | | |
| 2009/0013932 A1* | 1/2009 | Sakamoto ................... 118/719 | | | |
| 2009/0023271 A1* | 1/2009 | Couillard et al. ............. 438/458 | | | |
| 2009/0026068 A1* | 1/2009 | Hongo et al. ................ 204/199 | | | |
| 2009/0069741 A1* | 3/2009 | Altshuler et al. ............... 604/22 | | | |
| 2009/0098297 A1* | 4/2009 | Sakai et al. .................. 427/314 | | | |
| 2009/0098298 A1* | 4/2009 | Miyata et al. ............. 427/372.2 | | | |

FOREIGN PATENT DOCUMENTS

| | | |
|---|---|---|
| JP | 3-276624 | 12/1991 |
| JP | 4-243119 | 8/1992 |
| JP | 2001-189368 | 7/2001 |
| JP | 2004-128249 | 4/2004 |
| JP | 2004-235469 | 8/2004 |
| JP | 2004-273846 | 9/2004 |

* cited by examiner

HEATING APPARATUS, AND COATING AND DEVELOPING APPARATUS

BACKGROUND OF THE INVENTION

1. Field of the Invention

The present invention relates to a heating apparatus for heating a substrate on which a coating liquid has been coated, and a coating and developing apparatus including the heating apparatus.

2. Background Art

As an apparatus for forming a resist pattern on a glass substrate for use in a semiconductor wafer (hereinafter, referred to as "a wafer") or an LCD (Liquid Crystal Display), a coating and developing apparatus is used, which coats a resist on the wafer and then develops the wafer after exposure. In this apparatus, a heating apparatus is incorporated, which is also referred to as a baking apparatus and serves to dry a solvent of a resist liquid, for example, in an apparatus for heating a wafer on which the resist liquid is coated.

With such a heating apparatus, we have attempted to perform a heating treatment by forming an air current passage by covering a region above a heating plate for heating a wafer with a cover, and forming an air current flowing in one direction from one end opening to another of the passage, i.e., the so-called one-way air current. By achieving this heating treatment utilizing the formation of such an air current, attachment of sublimates, to be produced from sublimation from the resist liquid, onto a wafer W as particles, can be reduced.

FIG. 16 depicts one example of a heating apparatus for forming the one-way air current as described above. In the drawing, reference numeral 10 denotes a housing, 10a designates a carrying opening for a wafer, and 10b denotes a shutter for opening and closing the carrying opening for a wafer. Also, in this drawing, reference numeral 11 is a base plate, 12 denotes a heating plate, and 13 is a cooling plate which is movable on the base plate 11 toward the heating plate 12 and adapted to cool a wafer W. On the base plate 11, a gas supplying portion 14 is provided on the front side of the heating plate 12, while a gas exhausting portion 15 is disposed on the back side of the heating plate 12.

In the internal space of the base plate 11, lifting mechanisms 16, 17 for raising and lowering pins 16a, 17a are provided. By the raising and lowering of the pin 16a using the lifting mechanism 16, a wafer W is transferred between the cooling plate 13 and an external carrying mechanism (not shown) which will enter the housing 10 through the carrying opening 10a. Similarly, by the raising and lowering of the pin 17a due to the lifting mechanism 17, the wafer W is transferred between the heating plate 12 and the cooling plate 13. Further, in the drawing, reference numeral 18 denotes a cover-like top plate which can be raised and lowered by a lifting mechanism 18a.

In such a heating apparatus, as shown in FIG. 17(a), the wafer W is transferred to the cooling plate 13, with the heating plate 12 being covered with the top plate 18 as well as being heated to a predetermined temperature. Next, as shown in FIG. 17(b), the top plate 18 is raised, the cooling plate 13 is then moved into between the top plate 18 and the heating plate 12, and the wafer W is transferred from the cooling plate 13 to the heating plate 12. Thereafter, as shown in FIG. 17(c), the cooling plate 13 is retracted to a position to adjoin the heating plate 12, and the top plate 18 is then lowered to such a position that it is located slightly above the heating plate 12. In this state, a gas is supplied from the gas supplying portion 14 while discharging it via exhausting portion 15 so as to form a current of the gas flowing in one direction from the gas supplying portion 14 to the exhausting portion 15 in the space defined between the heating plate 12 and the top plate 18, thus performing a predetermined heating treatment. Thereafter, the wafer W having been subjected to the heating treatment will be transferred from the heating plate 12 to the cooling plate 13 after the top plate 18 is raised again. Subsequently, the wafer W will be transferred from the cooling plate 13 to the carrying mechanism (not shown) and then carried to a next step.

In such a heating apparatus, a cooling mechanism was provided for the cooling plate 13, such as by arranging a cooling pipe, for example, in the interior or at the bottom face thereof, to enable a cooling liquid to flow through the cooling pipe. Accordingly, the cooling plate 13 is required to have a thickness of about 10 mm. Therefore, between the heating plate 12 and the top plate 18, a gap greater than 10 mm should be required to meet both of such a thickness of the cooling plate 13 and the clearance for transferring the wafer W. However, such a large gap between the heating plate 12 and the top plate 18 may promote the entering of an external air into the gap, causing disturbance of the air current, thus compromising a desired one-way air current. Consequently, exhaustion of sublimates along a predetermined direction can not be performed satisfactorily, resulting in increase of the amount of attachment, onto the wafer W, of the sublimates produced from a resist liquid.

For this reason, the top plate 18 was configured to be optionally raised and lowered such that, when the wafer W is transferred between the cooling plate 13 and the heating plate 12, the top plate 18 is raised, while when the heating treatment is performed, it is lowered to a predetermined position. However, such raising and lowering motions of the top plate 18 may also disturb the air current in the interior of the heating apparatus. Accordingly, the exhaustion of sublimates can not be achieved satisfactorily, also causing attachment of particles onto the wafer W.

In order to enhance the throughput of the coating and developing apparatus in which the heating apparatus is incorporated, a relatively high throughput, for example, about 200 pieces, of wafers, as the number to be processed per hour, is needed also in the heating apparatus. To address this challenge, the working time except for the time required for heating the wafer W and for roughly removing heat just after the heating treatment, i.e., the overhead time, should be reduced as much as possible. However, for the aforementioned heating apparatus, the time required for the raising and lowering of the top plate 18 as well as for the transfer of the wafer W between the cooling plate 13 and the heating plate 12 should inevitably be the overhead time, resulting in reduction of the throughput.

To solve such a problem, we have attempted to construct a heating apparatus in which, rather than using the cooling plate 13 to carry the wafer W to the heating plate 12, a thin-type rigid arm can transfer the wafer W from the cooling plate 13 to the heating plate 12 so that the necessity of raising and lowering the top plate 18 of the heating plate 12 as well as of transferring the wafer W between the cooling plate 13 and the heating plate 12 can be eliminated. If the wafer W is of a size of 12-inches or greater, a warp may tend to occur in such a wafer W. In addition, in the case where the wafer W is placed 6n the heating plate 12 for the heating treatment, errors concerning carriage, such as displacement and falling of the wafer W, may tend to take place upon positioning such a warped wafer W on the heating plate 12. To address this problem, a method of heat-treating the wafer W while holding it in a floated state over the heating plate using a thin-type arm has been studied. With respect to this construction in which the wafer W is carried over the heating place using such a thin-type rigid arm, one example which carries the wafer using wires is described in Patent Document 1.

However, this Patent Document 1 does not suppose that the carrying mechanism can be applied to a heating apparatus including a cooling plate and a heating plate, that control of disturbance of an air current in a heating apparatus can be utilized to reduce the amount of attachment of particles to the wafer W, and that a heat treatment can be performed while holding the wafer W in a floated state over the heating plate using an arm. In addition, the Patent Document 1 does not touch on reduction of the overhead time required for the operation of the top plate 18 as well as for the transfer of the wafer to the heating plate. Therefore, it should be difficult for the Patent Document 1 to achieve the challenge which is a primary object of the present invention.

Document Cited

Patent Document 1: JITUKAISHO No. 62-17133, KOHO

SUMMARY OF THE INVENTION

The present invention was made in light of the above, and it is an object thereof to enhance the throughput by reducing the overhead time and/or reduce the amount of attachment of particles onto a substrate, in a heating apparatus including a cooling plate and a heating plate.

The present invention is a heating apparatus, comprising: a treatment chamber; a flat heating chamber provided in the treatment chamber, with its one side opening for carrying in and carrying out a substrate; a pair of heating plates disposed on and under the heating chamber, respectively; a cooling plate provided in the treatment chamber located in the vicinity of the opening of the heating chamber and adapted to cool the substrate which has been heated by the heating plates; and a carrying means provided in the treatment chamber and adapted to carry the substrate along a carrying route defined between an upper position of the cooling plate and the interior of the heating chamber such that a heat treatment for the substrate can be performed for the substrate being held in the heating chamber.

The present invention is the heating apparatus described above, wherein the carrying means comprises a plurality of wires extending in a direction crossing the carrying route for the substrate and adapted to carry the substrate while holding it thereon.

The present invention is the heating apparatus described above, wherein the carrying means further comprises wire supporting portions for supporting both ends of the wires, and a moving mechanism adapted to move the wire supporting portions such that the substrate can be carried along a carrying route defined between the upper position of the cooling plate and the interior of the heating chamber.

The present invention is the heating apparatus described above, wherein grooves are formed in the cooling plate such that the wires can get therein, and wherein the substrate on the wires can be transferred to the cooling plate by raising the cooling plate, using a lifting apparatus, relative to the wires to drive the wires to get in the grooves, while the substrate on the cooling plate can be transferred to the wires by driving the wires to get out upward from the grooves.

The present invention is the heating apparatus described above, wherein the carrying means includes a thin plate member with a thickness of 3 mm or less for holding the periphery of the substrate.

The present invention is the heating apparatus described above, wherein the thin plate member includes a plate member having an inner peripheral face extending along a part of the periphery of the substrate, and a plurality of holding portions projecting inward from the plate member and adapted to hold a part of the periphery on the back face side of the substrate.

The present invention is the heating apparatus described above, wherein grooves are formed in the cooling plate such that the holding portions can get therein, and wherein the substrate on the holding portions can be transferred to the cooling plate by raising the cooling plate, using a lifting apparatus, relative to the holding portions to drive the holding portions to get in the grooves, while the substrate on the cooling plate can be transferred to the holding portions by driving the holding portions to get out upward from the grooves.

The present invention is the heating apparatus described above, wherein cooling plate notched portions corresponding to the shape of an external carrying mechanism are formed in the periphery of the cooling plate, and wherein when the substrate is transferred from the external carrying mechanism holding the substrate placed thereon to the cooling plate, the external carrying mechanism holding the substrate placed thereon is advanced over the cooling plate, passes through the cooling plate from above to below through the cooling plate notched portions so as to transfer the substrate to the cooling plate, and then retracts from between the cooling plate and the carrying means.

The present invention is the heating apparatus described above, wherein the height in the vertical direction of the opening formed on one side of the heating apparatus for carrying in and carrying out the substrate is 6 mm or less.

The present invention is a coating and developing apparatus including: a carrier block which carriers storing substrates are carried in and carried out; a treatment block, including a coating unit for coating the surface of each substrate, taken out from each carrier, with a resist, a heating apparatus for heating the substrate coated with the resist, a cooling unit for cooling the heated substrate, and a developing unit for developing the substrate after being exposed; and an interfacing unit adapted to transfer the wafer between the treatment block and an exposing apparatus; wherein the heating apparatus, comprising: a treatment chamber; a flat heating chamber provided in the treatment chamber, with its one side opening for carrying in and carrying out a substrate; a pair of heating plates disposed on and under the heating chamber, respectively; a cooling plate provided in the treatment chamber located in the vicinity of the opening of the heating chamber and adapted to cool the substrate which has been heated by the heating plates; and a carrying means provided in the treatment chamber and adapted to carry the substrate along a carrying route defined between an upper position of the cooling plate and the interior of the heating chamber such that a heat treatment for the substrate can be performed for the substrate being held in the heating chamber.

In the present invention described above, the substrate can be carried in the heating chamber having a flat space, while being held on the carrying means, and then be subjected to a heat treatment as it is. Also in the present invention, a cover which can be optionally raised and lowered is not provided to the heating chamber, and the action for transferring the substrate to the heating plate is unnecessary. Therefore, the action for raising and lowering the cover as well as the time required for transferring the substrate to the heating plate can be eliminated, thus the overhead time can be reduced in accordance with the time saving, thereby enhancing the throughput. In addition, since the heat treatment can be performed with the substrate being floated over the heating plates, even when the substrate is warped, the action for placing the warped substrate onto the heating plate becomes unnecessary. Thus, the possibility of occurrence of mistakes in carrying the substrate caused by its warp can be eliminated, thereby performing the heat treatment in a stable state.

Furthermore, since a cover which can be optionally raised and lowered is not provided in the heating chamber, there-is no possibility of occurrence of disturbance of the air current in the heating chamber to be caused by raising and lowering of such a cover. Accordingly, the air current in the heating apparatus becomes difficult to be disturbed, thereby reducing attachment of particles onto substrate to be caused by the occurrence of disturbance of the air current.

DETAILED DESCRIPTION OF THE INVENTION

Examples

Figure 1:
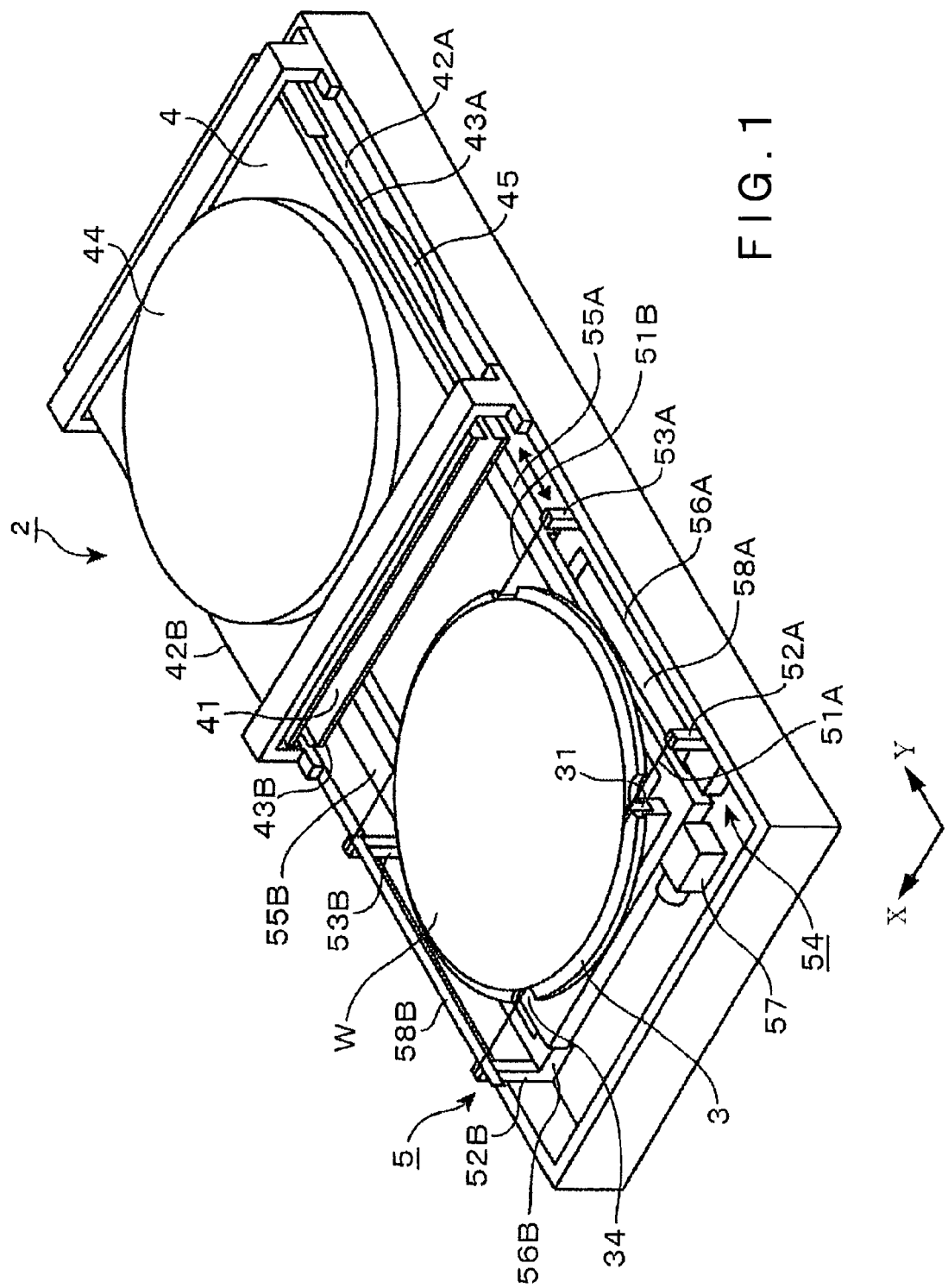
FIG. 1 is a perspective view showing an embodiment of a heating apparatus of the present invention.
Figure 2:
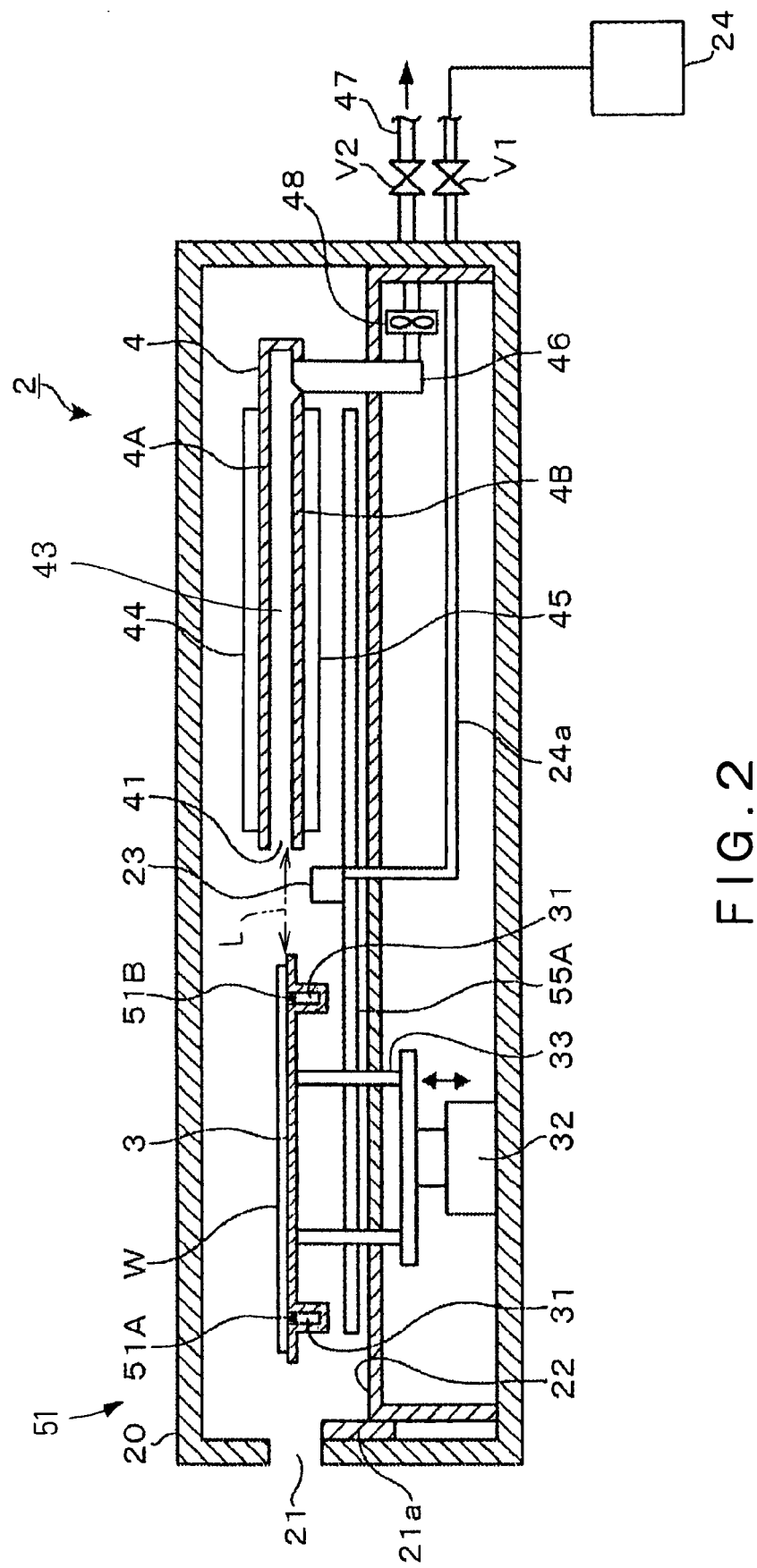
FIG. 2 is a cross-section showing the heating apparatus.

As one example of an embodiment of a heating apparatus according to the present invention, a heating apparatus 2 adapted to heat a wafer W, which is, for example, a substrate having a resist liquid as a coating liquid coated on its surface, so as to form a resist film on the surface of the wafer W will be described below with reference to FIGS. 1 to 7. In respect of the size of the wafer W, the water W having a size of 12 inches may be used, for example. The heating apparatus 2, as shown in FIG. 2, comprises a housing 20 constituting a treatment chamber. A carrying opening 21 for the wafer W is formed in a side wall of the housing 20 such that the carrying opening 21 can be optionally opened and closed by a shutter 21a. While the shutter 21a is provided to prevent disturbance of an air current to be formed around the wafer W as described below due to inflow of an external air into the housing 20 through the carrying opening 21, the inflow of an external air may also be prevented by providing an air curtain in the vicinity of the carrying opening 21, rather than using the shutter 21a.

A base 22 is arranged at a lower portion in the housing 20, and if the side nearer to the carrying opening 21 is represented as the front side, a cooling plate 3 for cooling the wafer W is provided on the front side of the base 22, while a flat heating chamber 4 for heating the wafer W is provided on the back side. The side wall of the heating chamber 4 facing the cooling plate 3 is opened to form an opening 41 for carrying in and carrying out the wafer W. The wafer W is carried by a carrying means 5 along a carrying route (L) defined between an upper position of the cooling plate 3 and the interior of the heating chamber 4, in which a heat-treatment is performed with the wafer W being held by the carrying means 5.

The cooling plate 3 is formed of aluminum, for example, shaped in a generally circular plate with substantially the same diameter as the wafer W, and designed to have a thickness of about 4 mm in the region other than grooves described below. The cooling plate 3 is configured to have a cooling mechanism (not shown) for supplying, for example, temperature controlling water therein on the back face side so as to roughly cool the wafer W placed on the cooling plate 3.

The carrying means 5 extends in a direction (direction X in FIGS. 1 and 3) crossing the longitudinal direction of the carrying route (L) for the wafer W in the housing 20, and includes a plurality of, for example, two, wires 51 (51A, 51B) for carrying the wafer W while holding it thereon. The wires 51 include synthetic fibers, such as aramid fibers (e.g., Kepler, produced by DuPont) or the like, silicon carbide fibers (e.g., Nicaron, produced by Nippon Carbon Co., Ltd.), ceramic fibers, such as carbon fibers (e.g., those, produced by Toray Co., Ltd.), and are formed of heat-resisting materials not denatured by heat even if subjected to a heat treatment at 23° C. to 250° C., with those having a thickness, for example, of about 0.5 mm diameter being employed.

Figure 3:
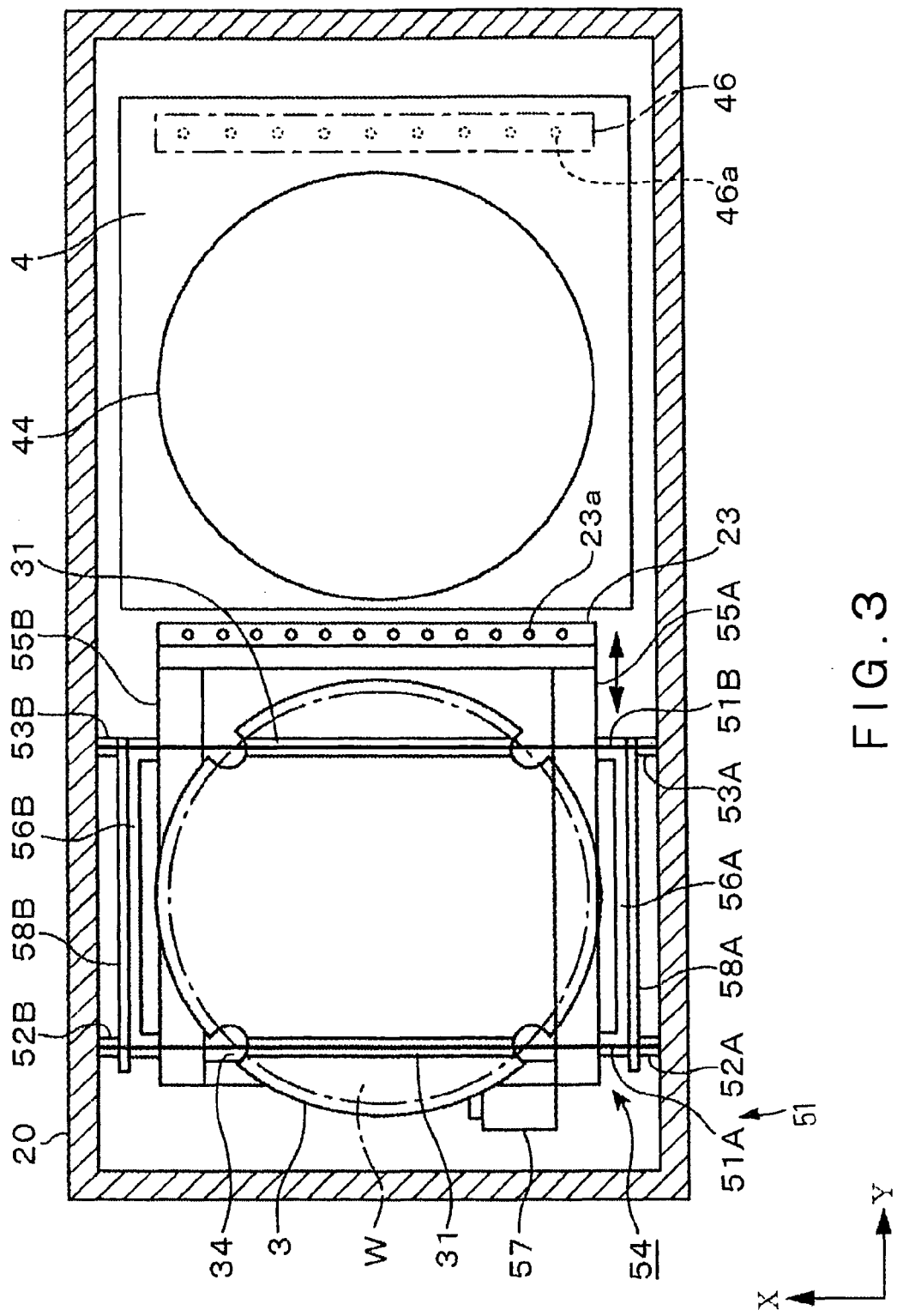
FIG. 3 is a plan view showing the heating apparatus.

Such wires 51A, 51B have a length longer than the diameter of the wafer W or cooling plate 3, with both ends being supported by a pair of wire supporting member 52 (52A, 52B), 53 (53A, 53B), respectively. These wire supporting members 52, 53 are configured to be moved by a moving mechanism 54 to carry the wafer W between an upper position of the cooling plate 3 and the interior of the heating chamber 4. As shown in FIGS. 1 to 3, the position in which the wires 51 are located on the side of the cooling plate 3 is referred to as a home position.

The moving mechanism 54, as shown in FIGS. 1 to 3, are provided at upper portions of the base 22, and includes a pair of guide rails 55A, 55B extending along the direction Y in the housing 20; a first wire moving member 56A to which the wire support members 52A, 53A (located on one side (the right side) in the traverse direction of the wafer W when seen from the carrying opening 21) are integrally attached, and which is adapted to move along the guide rail 55A; a second wire moving member 56B to which the wire support members 52B, 53B (located on the other side (the left side) in the traverse direction of the wafer W when seen from the carrying opening 21) are integrally attached, and which is adapted to move along the guide rail 55B; and a driving member 57 adapted to move the first and second wire moving members 56A, 56B together along the guide rails 55A, 55B. The driving member 57 is configured such that its driving operation is controlled based on instructions given from a control unit as described below.

Figure 4:
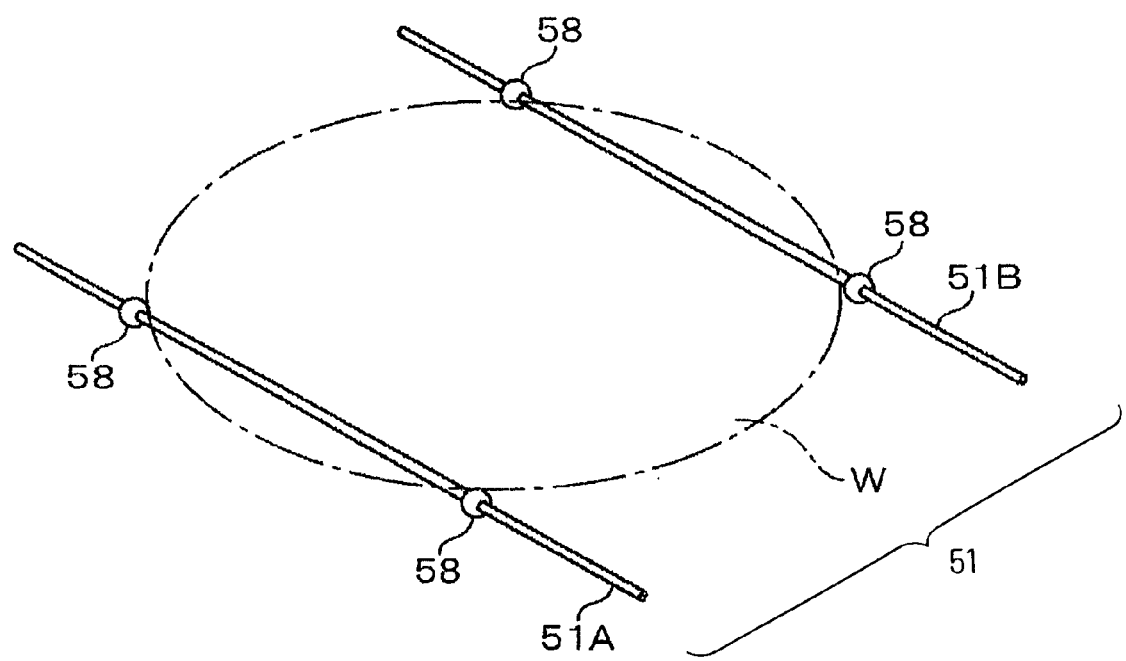
FIG. 4 is a perspective view showing bead members used in the heating apparatus.

For the wires 51, as shown in FIG. 4, bead members 58 for restricting the mounting position of wafer W are provided, for example, two bead members 58 are provided on each of the wires 51A, 51B. The bead members 58 are arranged in the wires 51A, 51B such that they correspond to four positions around the periphery of the wafer W. Thus, by placing the wafer W inside the respective bead members 58, the peripheral four positions of the wafer W can be securely located due to the bead members 58, and even when moved by the wires 51, the mounting position of wafer W during the movement will not be displaced. For convenience, bead members 58 are omitted in FIGS. 1 to 3.

In the cooling plate 3, grooves 31 in which the wires 51 can get are formed in positions corresponding to the two wires 51A, 51B when the carrying means 5 is located at the home position. The grooves are sized such that the bead members 58 provided to the wires 51 can also get therein. In addition, a lifting mechanism 32 which can raise and lower the cooling plate 3 is provided below the cooling plate 32 in the interior of the base 22. To the lifting mechanism 32, a plurality of supporting pins 33 are connected. By means of the lifting mechanism 32, these supporting pins 33 can be vertically projected from and retracted in the base 22 through apertures formed therein.

The cooling plate 3 is configured to be optionally raised and lowered relative to the wires 51 by means of the lifting mechanism 32. Accordingly, by raising and lowering the cooling plate 3 relative to the wires 51, and hence by driving the wires 51 to deeply get in the respective grooves 31, the wafer W on the wires 51 can be transferred to the cooling plate 3, while by driving the wires 51 to get out upward from the grooves 31 of the cooling plate 3, the wafer W on the cooling plate 3 can be transferred to the wires 51. Alternatively, rather than raising and lowering the cooling plate 3, the cooling plate 3 may be configured to be apparently raised and lowered relative to the wires 51 by designing the wires 51 such that they can be raised and lowered.

In four positions of the periphery of the cooling plate 3, for example, as shown in FIGS. 1 and 3, notched portions 34 (cooling plate notched portions) are formed toward the central portion of the cooling plate 3. The notched portions 34, as described below, are necessary when the wafer W is transferred between an external carrying mechanism and the cooling plate 3. It should be noted that, in FIG. 1, the cooling plate 3 is depicted to be larger than the wafer W in order to show the notched portions 34.

While the holding positions of the wafer W by the wires 51 are selected as appropriate, in this example, the wires 51 are set to hold the wafer W in the vicinity of the position where the wafer W is held by an external carrying mechanism as described below. Therefore, in the cooling plate 3, the groove 31 corresponding to the wire 51A is formed to connect the two front side notched portions 34, while the groove 31 corresponding to the wire 51B is formed to connect the two back side notched portions 34.

The heating chamber 4 is adapted to heat the wafer W in the interior thereof, and as such has an internal space larger than the wafer W. The heating chamber 4 is formed to have a U-shaped cross-section, and made of a heat-conductive material, such as aluminum or stainless steel, having a thickness of about 3 mm. In both side walls 42 (42A, 42B) of the opening 41, gaps 43 (43A, 43B) of about 3 mm are formed, respectively, such that the wires 51A, 51B can get in these gaps 43.

The size in the vertical direction of the opening 41 is set at 6 mm or less to form a flat space therein.

At an upper portion and a lower portion of the heating chamber 4, heating plates 44, 45 formed, for example, from aluminum nitride (AlN) or silicon carbide (SiC) are provided, respectively. These heating plates 44, 45 are formed into a disk having, for example, substantially the same size as the wafer W. By heating these heating plates 44, 45, the interior of the heating chamber 4 can be heated.

A gas discharging portion 23 is provided on the front side of the heating chamber 4 on the base 2, while an exhausting portion 46 is disposed on the back side of the interior of the heating chamber 4. It is noted that the gas discharging portion 23 and the exhausting portion 46 are omitted in FIG. 1. When the wafer W is placed in the heating chamber 4, the gas discharging portion 23 and the exhausting portion 46 are located on the front side and on the back side of the wafer W, respectively. In such a way, the gas discharging portion 23 and the exhausting portion 46 are provided respectively such that an air current, the so-called one-way gas current, can be created. The gas current covers the diameter length (width) of the wafer W and flows from the front side to the back side between the top plate 4A and the bottom plate 4B of the heating chamber 4, i.e., from one side to the other side of the wafer W.

Figure 5:
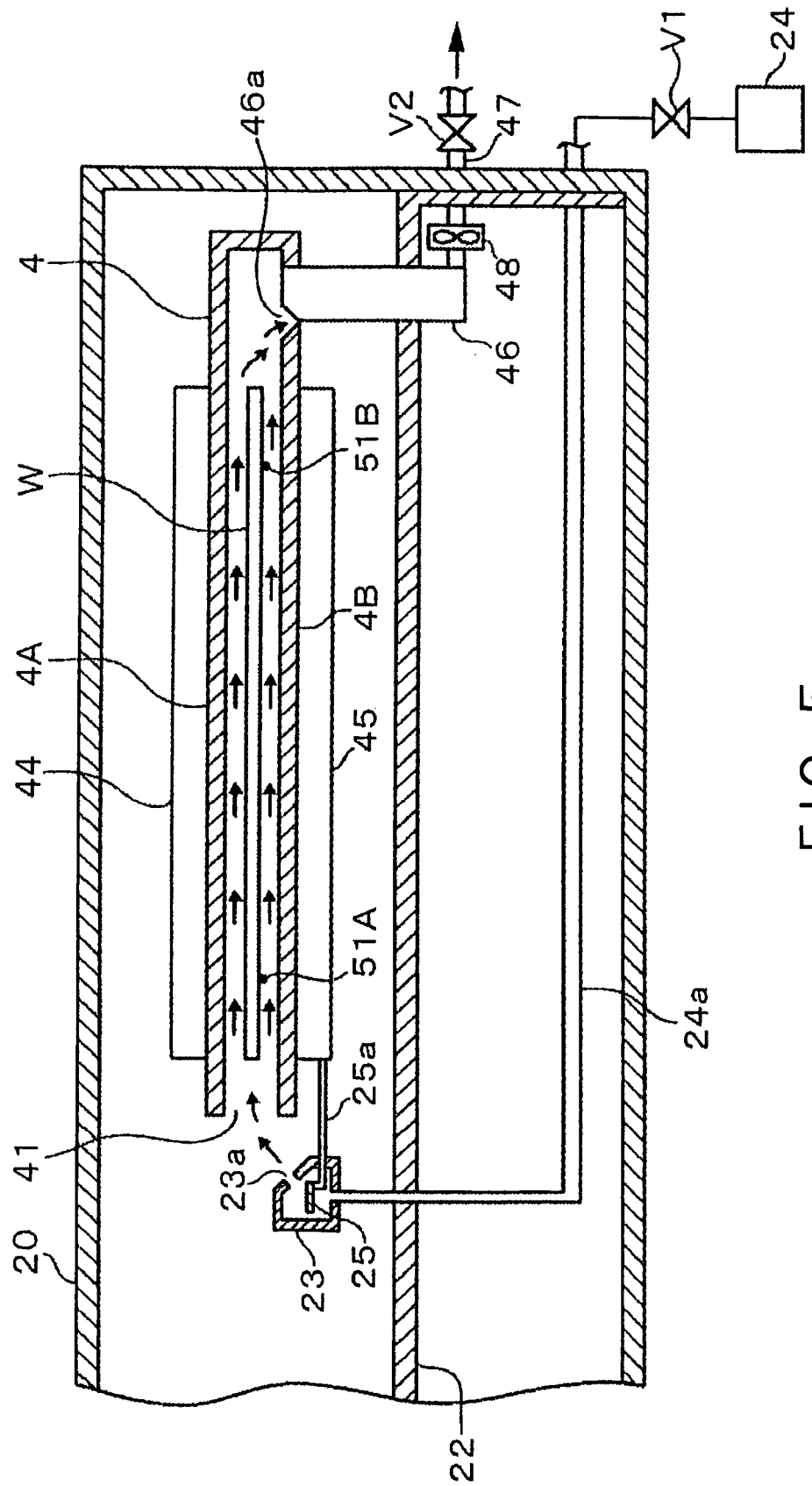
FIG. 5 is a cross-section showing a heating chamber used in the heating apparatus.

The gas discharging portion 23, as shown in FIG. 5, has an inclined face opposing the opening 41 of the heating chamber 4 in the housing 20. In the inclined face, for example, a plurality of small apertures are provided as discharging openings 23a at a predetermined interval along the width direction (direction X in the drawing) of the housing 20. The length from one end to the other end of these discharging openings 23a is designed to cover the diameter of the wafer W placed in the heating chamber 4. The gas discharging portion 23 is connected to, for example, a gas supplying source 24 provided outside the housing 20 and storing a clean purging gas, for example, an inert gas such as nitrogen gas, via a gas supplying tube 24a and a valve V1.

In the interior of the gas discharging portion 23, a heat transfer plate 25 is disposed along the width direction. To the heat transfer plate 25, for example, one ends of a plurality of heat pipes 25a are connected at an interval along the width direction. The other end of each heat pipe 25a is connected to the heating plate 45, and the temperature of the purging gas supplied to the internal space of the gas discharging portion 23 via the gas supplying tube 24a from the gas supplying source 24 is controlled to the same temperature as the heated temperature of the wafer W (the surface temperature of the wafer W when heated) by the heat transfer plate 25. Thereafter, the purging gas is discharged from the discharging openings 23a. Alternatively, the means for heating the purging gas may be, for example, a heater provided in the vicinity of the outlet of the gas supplying tube 24a.

The wafer W is supported in the heating chamber 4 while being held by the wires 51, and is not in direct contacted with the heating plates 44, 45. However, the wafer W is heated via the heating chamber 4 constructed with a heat conductive material by the effect of the heating plates 44, 45. At the same time, by supplying the purge gas over the surface of the wafer W, the wafer W can be heated at a preset processing temperature.

The exhausting portion 46 includes an inclined face provided to oppose the gas discharging portion 23 with respect to the heating plate 45 disposed under the heating chamber 4, and extending from the bottom plate 4B of the heating chamber 4 to the inside of the heating chamber 4. In the inclined face, for example, a plurality of small apertures are provided as exhausting openings 46*a* at a predetermined interval along the width direction of the heating chamber 4. The length from one end to the other end of these exhausting openings 46*a* is designed to cover the diameter of the wafer W, for example. The exhausting portion 46 is connected to an exhausting tube 47, which extends out of the housing 20, and its opposing end is connected to a gas exhausting pipe line of a factory, for example. A fan 48 is disposed in the exhausting tube 47. By controlling the number of revolution of the fan 48, the exhausting portion 46 can effect exhaustion of the interior of the heating chamber 4 via the exhausting openings 46*a*, for example, at a preset displacement. In FIG. 5, reference character V2 denotes a valve provided in the exhausting tube 47.

In the present invention, as described above, the aim of providing the gas discharging portion 23 and the exhausting portion 46 is to create the one-way gas current as described above. Therefore, the aspect of providing the gas discharging portion 23 and the exhausting portion 46 is not limited to the construction of the aforementioned embodiment. Also, the shapes of the discharging openings 23*a* and the exhausting openings 46*a* are not limited to those in the aforementioned example. For example, they may be provided in a slit form arranged along the width direction.

Figure 6:
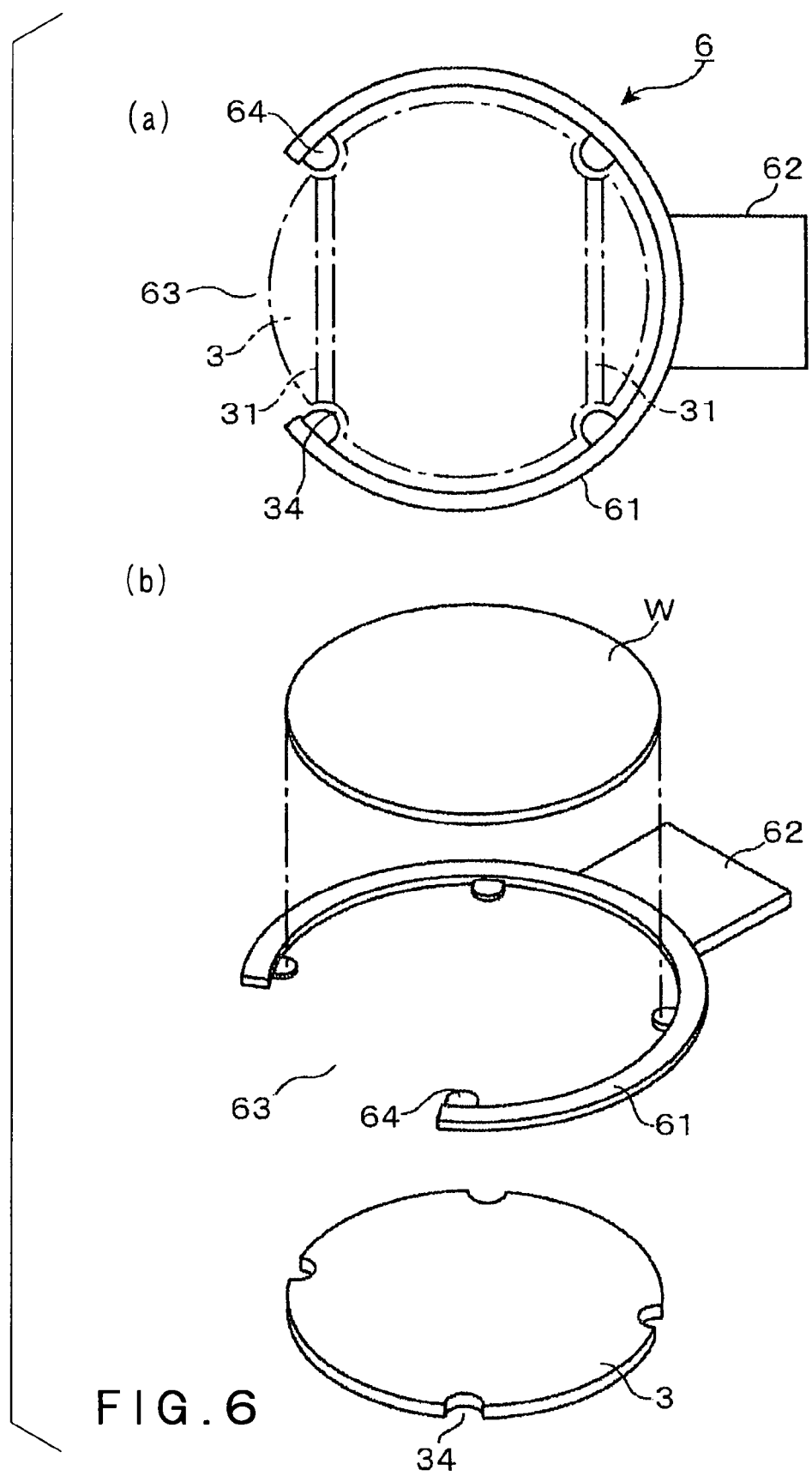
FIG. 6(a) is a plan view showing an external carrying mechanism for carrying a wafer W to the heating apparatus, and a cooling plate provided in the heating apparatus.
FIG. 6(b) is a perspective view of FIG. 6(a).

Next, the external carrying mechanism 6 adapted to transfer the wafer W to the cooling plate 3 will be described. The carrying mechanism 6, for example, as shown in FIG. 6, has a carrying arm 61 having a flat horse's hoof-like shape, and a carrying body 62 adapted to support the carrying arm 61. In a forward portion of the carrying arm 61, a notched portion (carrying arm notched portion) 63 is formed. The size of the inner periphery of the carrying arm 61 is set to be slightly larger than the diameter of the cooling plate 3. At bottom portions of the inner periphery, four projecting pieces 64 are provided projecting inward. As shown in FIG. 6(*b*), the wafer W is held on the projecting pieces 64. It is noted that the grooves 31 are omitted in the cooling plate 3 shown in FIG. 6(*b*).

The carrying arm 61 is configured to be optionally raised and lowered as well as optionally advanced and retracted via the carrying body 62 using, for example, a driving mechanism (not shown). When transferring the wafer to the cooling plate 3, the carrying means 5 is first moved to the home position, and the cooling plate 3 is then located to a position above the wires 51 such that the carrying arm 61 can be retracted through between the cooling plate 3 and the wires 51. In this way, the carrying arm 61 holding the wafer W thereon is advanced above the cooling plate 3 in the housing 20 through the carrying opening 21. The notched portions (cooling plate notched portions) 34 formed in the outer periphery of the cooling plate 3 are arranged at the positions respectively corresponding to those of the projecting pieces 64 of the carrying arm 61. Thus, as shown in FIG. 6(*b*), when the carrying arm 61 is lowered from above the cooling plate 3 to cover the plate 3, the carrying arm 61 can pass through the cooling plate 3 downward, and the wafer W on the carrying arm 61 can be transferred to the cooling plate 3. The carrying arm 61, after having transferred the wafer W onto the cooling plate 3, is lowered up to above the wires 51, then retracts toward the front side with the forward notched portions 63 passing through the outside of the grooves 31, and finally leaves the interior of housing 20.

Next, the positional relation of the components of the heating apparatus 2 will be described. In the present invention, the wires 51 can not be raised and lowered, but instead, the cooling plate 3 is designed to be optionally raised and lowered. The height of the heating chamber 4 is set such that the wires 51 holding the wafer W can be directly advanced therein, and the wafer W can be subjected to a heat treatment while being held on the wires 51. In addition, when the wafer W is located in the heating chamber 4, the position of the wafer W is set to have an equal interval from the top plate 4A as well as from the bottom plate 4B of the heating chamber 4. As described above, the wires 51 are configured to be moved in the gaps 43A, 43B of the side walls 42A, 42B of the heating chamber 4.

Also, as described above, when the wafer W is transferred from the carrying mechanism 6 onto the cooling plate 3, the carrying arm 61 is advanced above the cooling plate 3, and then leaves between the cooling plate 3 and the wires 51. Therefore, the depth of the grooves 31 and the size of the carrying outlet 21 should be set to carry out such operation. Namely, the depth of the grooves 31 should be designed to enable the carrying arm 61 to move between the cooling plate 3 and the wires 51.

In addition, the size of the notched portion 63 and the projecting pieces 64 of the carrying arm 61 and the positions (holding positions of the wafer W due to the wires 51) of the grooves 31 in the cooling plate 3 should be set such that the notched portion 63 and the projecting portions 64 can pass through the outside of the grooves 31 of the cooling plate 3. As shown in FIG. 6(*a*) and as described above, in this example, each groove 31 is provided to connect the two notched portions 34 formed in the direction crossing the advancing and retracting direction of the carrying arm 61, and is configured such that the projecting portions 64 and the notched portion 63 of the carrying arm 61 can be moved outside the notched portions 34 of the cooling plate 3. Therefore, the carrying arm 61 can pass through and leave between the bottom face of the cooling plate 3 and the wires 51 without interfering with the grooves 31.

Figure 7:
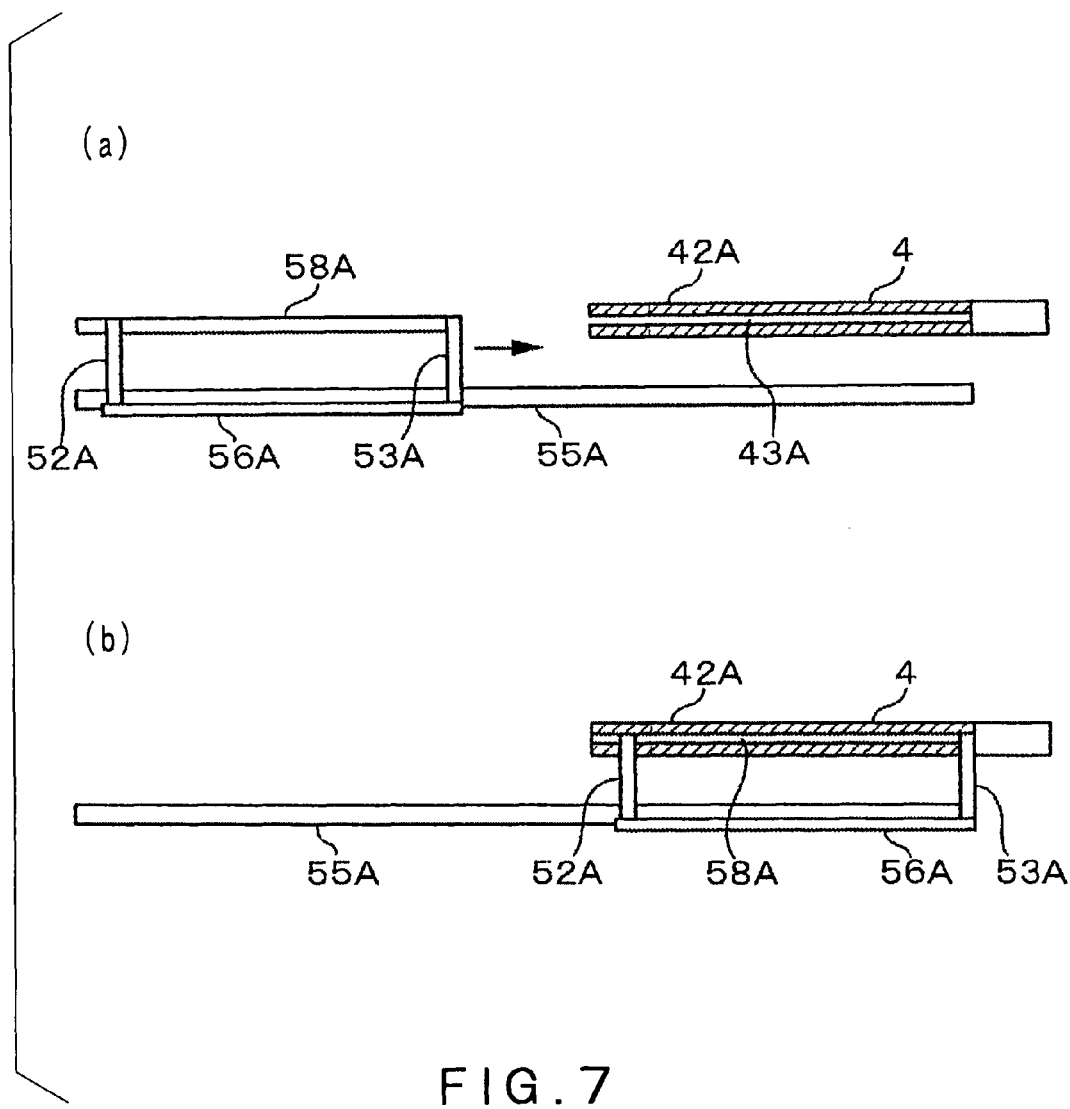
FIGS. 7(a) and 7(b) are side views showing a shielding member used in the heating apparatus, respectively.

Between the wire supporting members 52A, 53A and between the wire supporting members 52B, 53B of the wires 51, shielding plates 58A, 58B for closing the gaps 43A, 43B of the side walls 42A, 42B of the heating chamber 4 are provided, respectively. As shown in FIG. 7, when the wires 51 are moved toward the heating chamber 4, the shielding plates 58A, 58B will close the gaps 43A, 43B of the side walls 42A, 42B of the heating chamber 41, respectively. The shielding plates 58A, 58B are formed of stainless steel, aluminum, ceramics or the like into a size adequate to cover the gaps 42A, 43B.

Next, a control unit installed in the heating apparatus 2 will be described. The control unit includes a program storing unit comprising, for example, a computer. In the program storing unit, a program comprising, for example, a software, is stored, in which instructions are composed such that operation of the heating apparatus as described above, i.e., treatments for the wafer W, receiving and transferring the wafer W, heating of the wafer W, controlling of the air current or the like can be executed. By reading this program into the control unit, it can control the operation of the semiconductor manufacturing apparatus. The program may be stored in the program storing unit in a state stored in a storage medium, such as a hard disk, compact disk, magnet optical disk, or the like.

Figure 8:
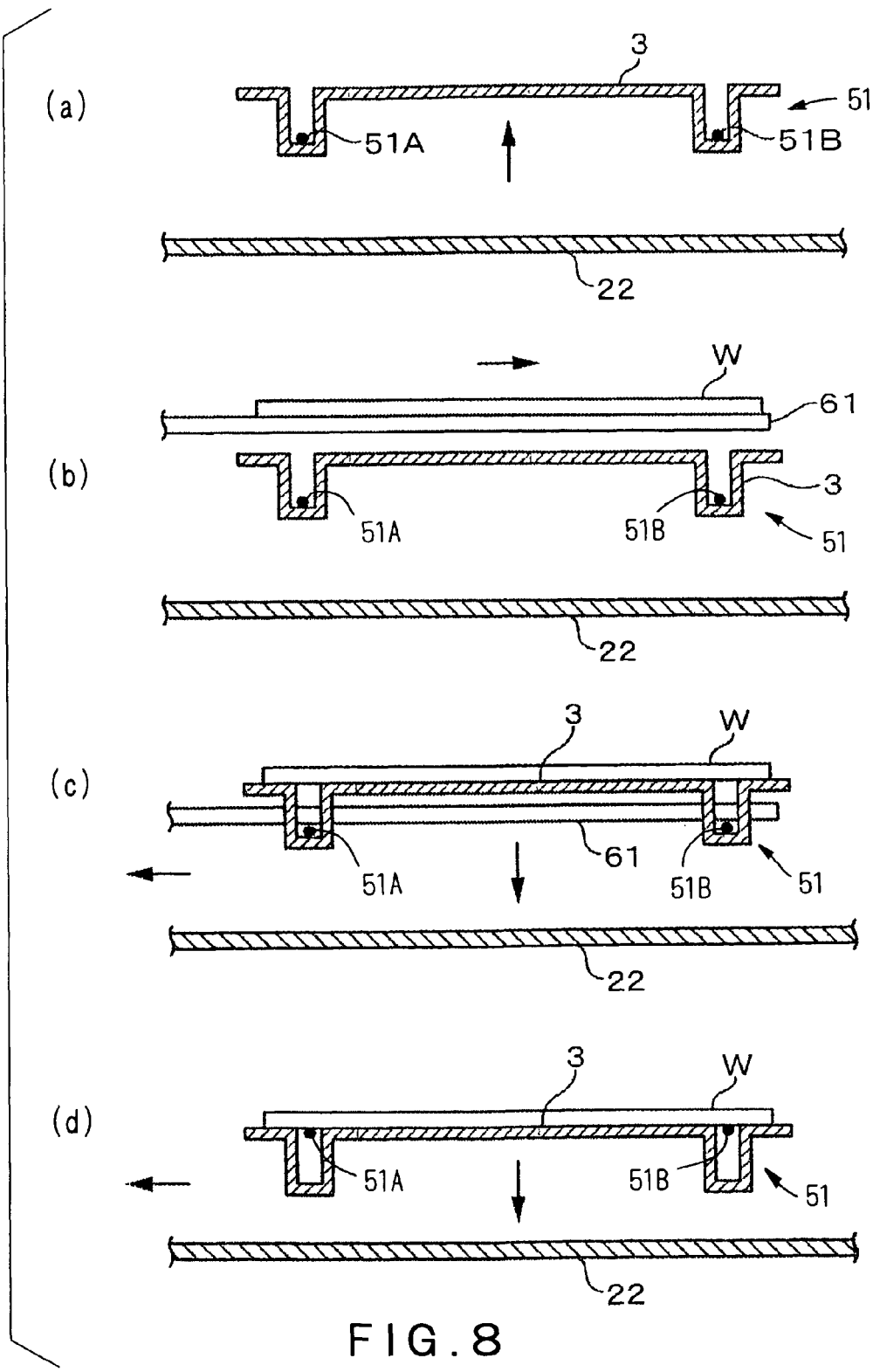
FIGS. 8(a), 8(b), 8(c) and 8(d) are provided to illustrate a process of operation of the heating apparatus.
Figure 9:
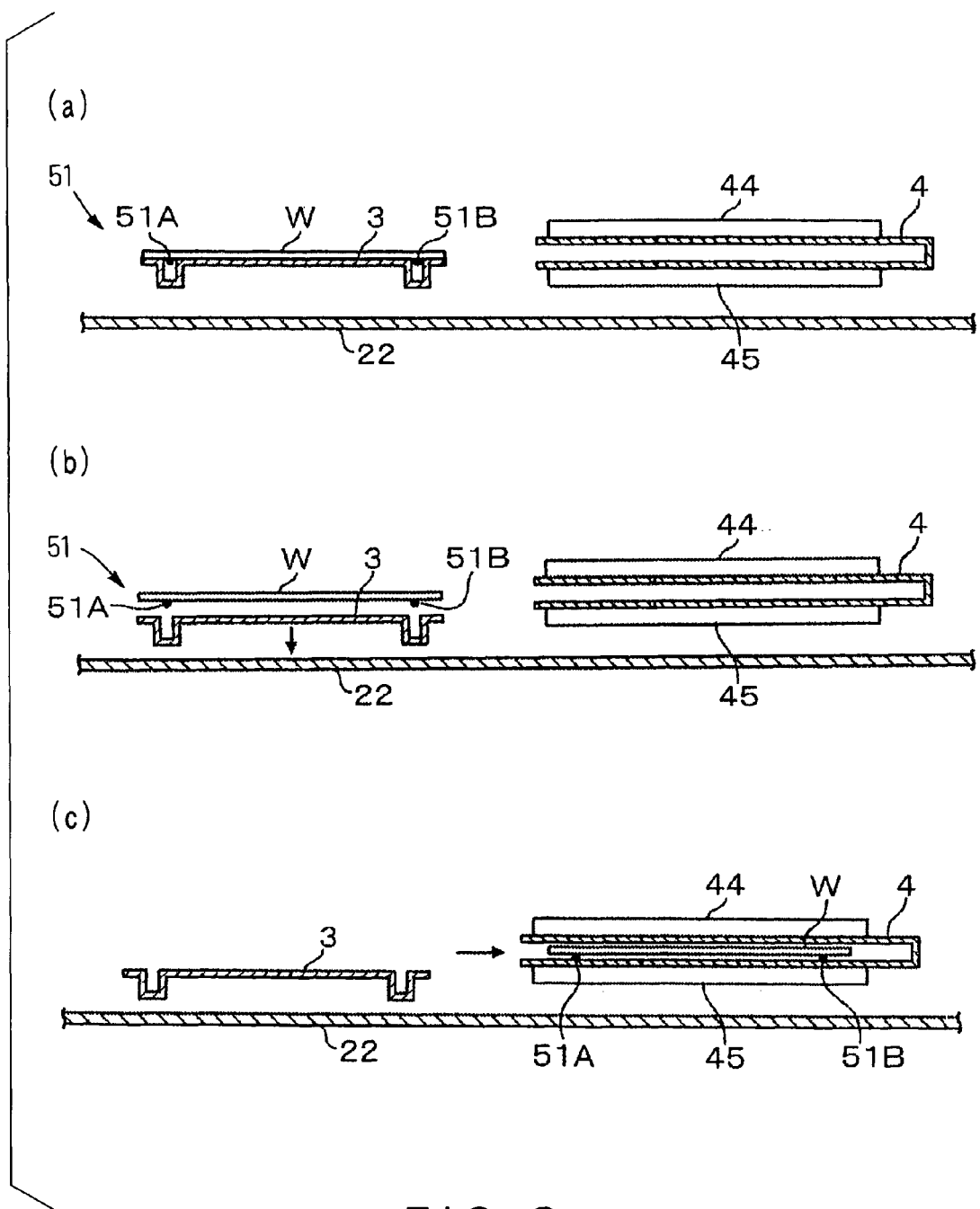
FIGS. 9(a), 9(b) and 9(c) are provided to illustrate a process of operation of the heating apparatus.

Next, operation of the heating apparatus 2 will be described. First, the wafer W coated with a resist liquid on it surface is carried in the housing 20 through the carrying opening 21 by the external carrying mechanism 6. The wafer W is then transferred onto the wires 51 comprising the wires 51A, 51B via the cooling plate 3. Namely, as shown in FIG. 8(*a*), the carrying means 5 is first located to the home position. The cooling plate 3 is then raised to form a passage for the carrying arm 61 of the external carrying mechanism to pass through between the bottom surface of the cooling mechanism 3 and the wires 51. Next, as shown in FIGS. 8(b) and 8(c), the carrying arm 61 holding the wafer W thereon is advanced over the cooling plate 3 and then lowered to transfer the wafer W onto the cooling plate 3. Subsequently, the carrying arm 61 is retracted back through between the bottom face of the cooling plate 3 and the wires 51. Thereafter, as shown in FIGS. 8(d) and 9(a), the cooling plate 3 is lowered in order to transfer the wafer W onto the wires 51. At this time, the wafer W is placed on the wires 51 such that its outer periphery is located inside the bead members 58 provided to the wires 51, thus the wafer W can be held on the wires 51 while being positioned by the bead members 58.

As shown in FIGS. 9(b) and 9(c), after further lowering the cooling plate 3, the wires 51 holding the wafer W are moved toward the heating chamber 4, thus carrying the wafer W into the heating chamber 4. In the heating chamber 4, the temperature has been elevated by the heating plates 44, 45 to approximately 100° C., for example, until the wafer W is carried therein by the wires 51.

In this way, when the wafer W is carried in the heating chamber 4 while being held by the wires 51, the valve V1 is opened, and a purging gas is supplied from the gas supplying source 24 to the gas supplying tube 24a. The purging gas is heated to approximately 100° C. at the discharging portion 23, and is then discharged from the discharging openings 23a toward the top plate 4A of the heating chamber 4. At substantially the same time as the start of discharging the purging gas from the discharging openings 23a, the valve V2 is opened, and exhaustion from the exhausting portion 46 is started by the rotation of the fan 48. As a result, as shown by arrows in FIG. 5, the purging gas supplied from the discharging portion 23 flows between the top plate 4A and the bottom plate 4B of the heating chamber 4 from the front side to the back side, passing through the surroundings of the wafer W, entering the exhausting portion 46, then removed from the housing 20. Namely, a current of the gas, as shown by the arrows in the drawing, flowing in one direction, is formed around the wafer W. In this way, heating and drying the resist liquid coated on the wafer W are performed by the heat applied from the heating plates 44, 45 as well as the current of the gas flowing in one direction, thereby forming a resist film on the wafer W. After a period of time for which the supply of the purging gas onto the wafer W has been performed, the supply of the purging gas from the gas supplying source 24 and the exhaustion from the exhausting portion 46 are stopped.

Subsequently, the wafer W is carried to the home position by the wires 15, followed by elevation of the cooling plate 3 to directly contact the bottom face of the wafer W with the cooling plate 3 or otherwise to form a gap, for example, of approximately 0.1 mm between the bottom face of the wafer W and the cooling plate 3, thereby cooling the wafer W by the cooling plate 3 to roughly remove the heat of the wafer W. After finishing the step of roughly removing the heat, the wafer W is transferred to the external carrying mechanism 6 via the cooling plate 3, and then carried outside the housing 20.

This transfer of the wafer W from the cooling plate 3 to the carrying mechanism 6 can be achieved by the reverse action to the transferring action of the wafer W from the carrying mechanism 6 to the cooling plate 3. Namely, the carrying arm 61 of the carrying mechanism 6 is advanced between the bottom face of the cooling plate 3 holding the wafer W and the wires 51, and the carrying arm 6 is then raised up to above the cooling plate 3, thereby transferring the wafer W from the cooling plate 3 onto the carrying arm 6. Thereafter, the carrying arm 61 holding the wafer W is retracted above the cooling plate 3.

In this heating apparatus 2, the heat treatment of the wafer W is conducted by carrying it into the heating chamber 4 having a flat space while the wafer W being held on the wires 51. In this case, no cover which can be optionally raised and lowered is provided to the heating chamber 4, and the heat treatment can be performed, rather than by transferring the wafer W onto the heating plate, but by positioning the wafer W away from the heating plates. Namely, the action of transferring the wafer W onto the heating plate is not required.

Therefore, the action of raising and lowering the cover and the operational time required for transferring the wafer W onto the heating plate becomes unnecessary, thus the overhead time can be reduced in accordance with such time saving, thereby enhancing the throughput. The transferring action of the wafer W from the carrying means to the heating plate can be achieved by providing supporting pins which are configured to be optionally raised and lowered, and adapted to be projected from and retracted in the surface of the heating plate. In general, the transferring action can be performed by projecting the supporting pins from the heating plate, transferring the wafer W from the carrying means onto the supporting pins, and then lowering the supporting pins to transfer the wafer W on the supporting pins to the heating plate. Accordingly, this action requires so many steps, thus elimination of such steps can lead to considerable reduction of the overhead time.

Also in the above example, since the heating plates 44, 45 are provided on and under the heating chamber 4, respectively, the wafer W in the heating chamber 4 can be heated from both the upper and lower portions of the heating chamber 4. In addition, since the heating chamber 4 is of a flat shape, thus providing a relatively small distance between the upper and lower heating plates 44, 45 and the wafer W, the temperature rising rate of the wafer W is significantly high, and therefore the time required for heating the wafer W to a predetermined temperature can be reduced, thereby decreasing the overhead time correspondingly to the time saving.

Namely, in this example, the wafer W is subjected to a heat treatment while being held on the wires 51 in a floated state over the heating plate 45, rather than being transferred onto the heating plate 45. Therefore, even when the wafer W is warped, the action for placing the warped wafer W onto the heating plate 45 becomes unnecessary. Thus, the possibility of occurrence of mistakes in carrying the wafer W caused by its warp can be eliminated, thereby performing the heat treatment in a stable state.

Furthermore, since the transferring action of the wafer onto the heating plate is not necessary, the size in the vertical direction of the interior of the heating chamber 4 needs not to have a clearance for receiving and transferring the wafer W, and the interior of the heating chamber 4 should have only a height which enables the wires 51 holding the wafer W can enter it. Accordingly, the internal space of the heating chamber 4 can be formed into a flat shape, thus reducing the gap in the opening 41.

In the heating apparatus 2, as described above, since a cover which can be optionally raised and lowered is not provided to the heating chamber 4, there is no risk of occurrence of disturbance of the gas current in the heating apparatus 2, which is caused by raising or lowering such a cover. Thus, the gas current in the heating apparatus 2 is difficult to be disturbed, thereby providing better control of the gas current. Accordingly, in such a heating apparatus which can form a gas current flowing in one direction, a proper one-way gas current can be formed while controlling the occurrence of gas current disturbance, leading to flying away of the sublimates on the air current, and hence to their exhaustion from the exhausting openings. In such a way, since the sublimates can be exhausted while following the air current, attachment of particles onto the wafer W can be reduced. In this case, the opening 41 of the heating chamber 4 is always opened. Since this opening 41 has a small gap of about 6 mm when measured as a vertical length, it is unlikely that disturbance of the air current occurs, as a result, a predetermined air current can be created.

Also, because of not transferring the wafer W from the carrying means onto the heating plate, disturbance of the gas current in the heating chamber 4 can not occur. When the transfer of the wafer W from the carrying means to the heating plate is performed in a series of actions including the raising and lowering of the supporting pins, the disturbance of the gas current may also occur due to such actions. However, since such transferring actions are eliminated, the air current disturbance can be prevented.

Since the raising and lowering of the cover and a driving mechanism for transferring the wafer W onto the heating plate become unnecessary as well, the driving system can be simplified and hence readily controlled, as compared to the case where raising and lowering the cover and/or transferring the wafer W onto the heating plate are necessary, thus reducing the space required. In addition, the notched portions 34 corresponding to the shape of the external carrying arm 61 are formed in the cooling plate 3 such that the external arm 61 holding the wafer W placed thereon can be advanced above the cooling plate 3 and then pass through the cooling plate 3 from above to below to transfer the wafer W onto the cooling plate 3. Accordingly, when compared to the case where supporting pins which can be optionally raised and lowered are provided for receiving and transferring the wafer W between the external carrying mechanism 6 and the cooling plate 3, the driving system can be further simplified, thereby providing a more reduced operating space.

Figure 10:
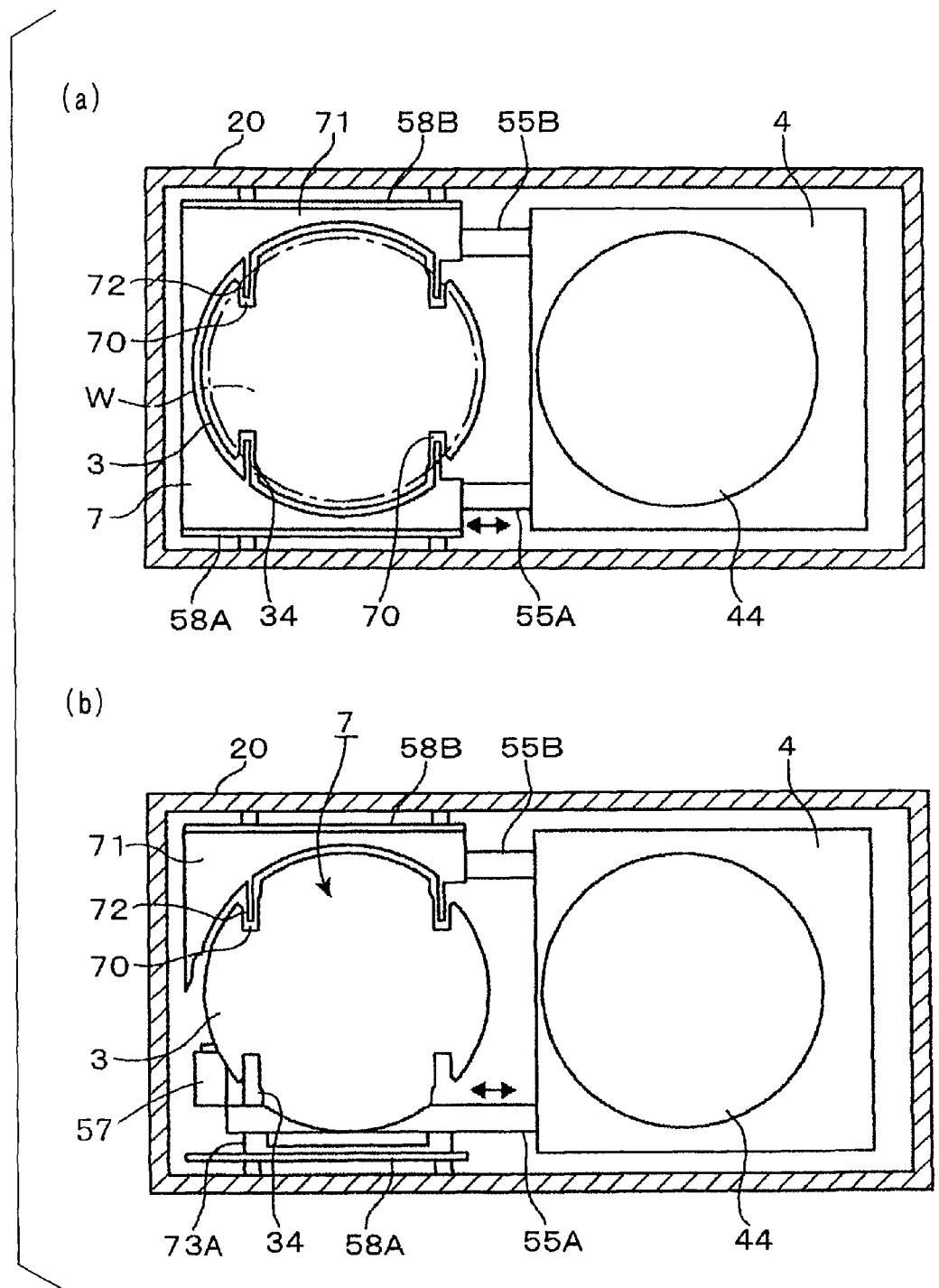
FIGS. 10(a) and 10(b) are plan views showing another example of the heating apparatus according to the present invention, respectively.

Next, another embodiment of the present invention will be described. The carrying means of this invention may comprise a thin plate member with a thickness of 3 mm or less, for holding, for example, the periphery of the wafer W. In this example, an arm plate 7 as shown in FIG. 10 is employed as the thin plate member. This arm plate 7 is formed of a rigid material, including ceramics or carbon materials, which will not be deformed even in a heat treatment performed at a temperature of 23° C. to 250° C. The arm plate 7 includes a plate member 71 having a circular arc to extend along the periphery of the wafer W, and a plurality of holding portion 72 which extend inwardly from the bottom portion of the inner periphery of the plate member 71 and are adapted to hold a portion on the back face side of the periphery of the wafer W.

Figure 11:
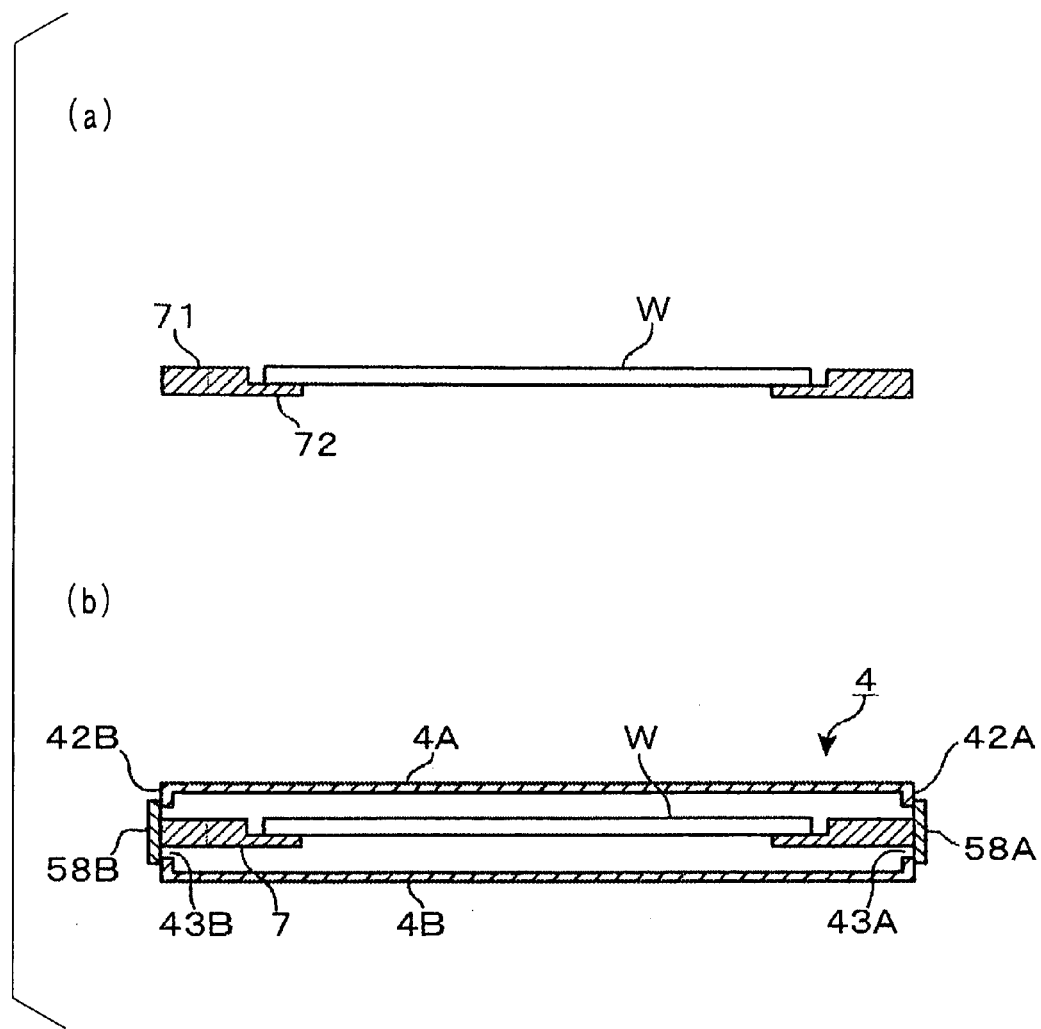
FIGS. 11(a) and 11(b) are side views showing an arm plate provided in the heating apparatus, respectively.

The inner periphery of the plate member 71 is sized slightly larger than the diameter of the cooling plate 3 such that the arcuate inner face of the plate member 71 is positioned outside the periphery of the wafer W and the cooling plate 3, as shown in FIG. 10, when the plate member 71 is positioned at the home position. In this example, the holding portions 72 are provided, for example, at substantially the same positions as those of the wires 51 in the aforementioned embodiment, which positions will correspond to the four notched portions 34 formed in the cooling plate 3 when the cooling plate 3 is located at the home position. In the arm plate 7, for example, as shown in FIG. 11, the thickness of the plate member 71 is set to have about 1 mm, while the thickness of the holding portions 72 is set to have about 0.5 mm, such that the position of the wafer W placed on the holding portions 72 can be determined by the inner peripheral face of the plate member 71.

In the cooling plate 3, grooves 70 that the holding portions 72 can get in are formed. The cooling plate 3 is configured to be optionally raised and lowered relative to the arm plate 7 by the effect of a lifting mechanism 32 as in the previously discussed embodiment. When the holding potions 72 get in the grooves 70, the wafer W on the holding portions 72 can be transferred to the cooling plate 3, while when the holding portions 72 get out upward from the grooves 70, the wafer W on the cooling plate 3 can be transferred onto the holding portions 72. The depth of the grooves 70 formed in the cooling plate 3 is set such that the carrying arm 61 can pass through between the bottom face of the cooling plate 3 and the holding portions 72.

Additionally, the arm plate 7 is configured to move between a position above the cooling plate 3 and the heating chamber 4 by a substantially the same mechanism as the wires 51. Namely, as shown in FIG. 10(b) illustrating a part of the moving mechanism, this mechanism is configured to move a pair of moving members 73A, 73B (73B is not shown) integrally along guide rails 55A, 55B by the effect of a driving member 57. In the drawing, reference numerals 58A, 58B designate shielding members, which are adapted to cover gaps 43A, 43B of the side walls 42A, 42B of the heating chamber 4, respectively, when the arm plate 7 is moved to the heating chamber 4. In this example, the gaps 43A, 43B are sized to allow the plate member 71 of the arm plate 7 to be inserted therein, respectively. The other portions are substantially the same as those in the above-described embodiment.

Also in this example, notched portions 34 fitting the shape of the carrying arm 61 are formed in the periphery of the cooling plate 6 such that the transfer of wafer W can be achieved between the external carrying mechanism 6 and the cooling plate 3. Upon transferring the wafer W from the carrying arm 61 to the cooling plate 3, the carrying arm 61 is advanced over the cooling plate 3 and then passes through the cooling plate 3 from above to below to transfer the wafer W onto the cooling plate 3. Thereafter, the carrying arm 61 is retracted through between the cooling plate 3 and the arm plate 7. Namely, the sizes of the notched portion 63 and the projecting pieces 64 as well as the positions of the grooves 70 in the cooling plate 3 (or the positions or size of the holding portions 72) are set such that these notched portion 63 and projecting pieces 64 of the carrying arm 61 can pass through the outside of the grooves 70 of the cooling plate 3.

In this example, when performing the heat treatment for the wafer W, the wafer W as an object of the heat treatment is first transferred by the external carrying mechanism 6 onto the arm plate 7 via the cooling plate 3. Namely, the arm plate 7 is initially located at the home position, the cooling plate 3 is then raised such that the carrying arm 61 of the external carrying mechanism can pass created between the cooling plate 3 and the holding portions 72. Subsequently, the carrying arm 61 holding the wafer W thereon is advanced over the cooling plate 3 and then lowered to transfer the wafer W onto the cooling plate 3. Thereafter, the carrying arm 61 is retracted through between the bottom face of the cooling plate 3 and the holding portions 72, thereby transferring the wafer W from the carrying mechanism 6 onto the cooling plate 3.

Thereafter, the cooling plate 3 is further lowered to transfer the wafer W placed thereon to the holding portions 72. In a state where the cooling plate 3 is further lowered, the arm plate 7 holding the wafer W is moved toward the heating chamber 4 to carry the wafer W in the heating chamber 4. In this way, the wafer W is subjected to a predetermined heat treatment while being held by the arm plate 7 in the heating chamber 4. After the heat treatment is ended, the wafer W is carried by the arm plate 7 to the home position above the cooling plate 3. Then, the cooling plate 3 is raised to be in contact with the bottom face of the wafer W, or otherwise, to form a gap of, for example, about 0.1 mm, between the cooling plate 3 and the bottom face of the wafer W. In this state, the wafer W is cooled by the cooling plate 3 to roughly remove heat of the wafer W just after the heat treatment. After finishing the step of roughly removing the heat, the wafer W is transferred to the external carrying mechanism 6 via the cooling plate 3, and then carried outside the housing 20. This transfer of the wafer W from the cooling plate 3 to the carrying mechanism 6 can be achieved by the reverse action to the transferring action of the wafer W from the carrying mechanism 6 to the cooling plate 3.

Also, in this example, since the wafer W is subjected to a heat treatment in the heating chamber 4 while being held on the arm plate 7, as is similar to the above-described embodiment, the actions for raising and lowering a cover and for receiving and transferring the wafer W relative to the heating plate can be eliminated. Further, since the time for raising and lowering a cover as well as for receiving and transferring the wafer W relative to the heating plate is unnecessary, the overhead time can be reduced, thereby enhancing the throughput.

In addition, since the heat treatment can be performed with the wafer W being floated over the heating plates, even when the wafer W is warped, it can be subjected to the heat treatment in a stable state. Furthermore, since the actions for raising and lowering a cover as well as for receiving and transferring the wafer W relative to the heating plate upon the heat treatment for the wafer W become unnecessary, disturbance of the air current to be caused by these actions can be controlled, thereby adequately exhausting sublimates, and reducing attachment of particles onto the wafer W.

In the above heating apparatuses of the present invention, for example, the heating chambers 4 and cooling plates 3 may be provided alternately such that the wafer W can be carried by a common carrying means, alternately, in an order, such as of from a first heating chamber 4 to a first cooling plate 3 and then to a second heating chamber 4, and so on. In such a case, in each heating chamber 4, a heat treatment is performed with the wafer W being held by the carrying means, and in each cooling plate 3, a step of roughly removing heat of the wafer W just after each heat treatment is conducted while the wafer W also being held by the carrying means. In this way, the heat history of the wafer W can be uniformed.

As stated above, in the heating apparatus 2 of the present invention, the shape of the carrying means 5 is not limited in particular, as long as the carrying means 5 is provided to be optionally raised and lowered relative to the cooling plate 3 such that it can transfer the wafer W to the cooling plate 3, carry the wafer W between the cooling plate 3 and the heating plate 4, and enable the wafer W to be subjected to a heat treatment while holding the wafer in the heating chamber 4, and then transfer the wafer W between the cooling plate 3 and the external carrying mechanism 6. Namely, in the case where the carrying means 5 comprises the wires 51, two or more wires 51 may be provided therein, while in the case where the means 5 comprises the arm plate 7, the shapes of the plate members 71 and the holding portions 72 or the number of the holding portions 72 may be selected optionally.

Figure 12:
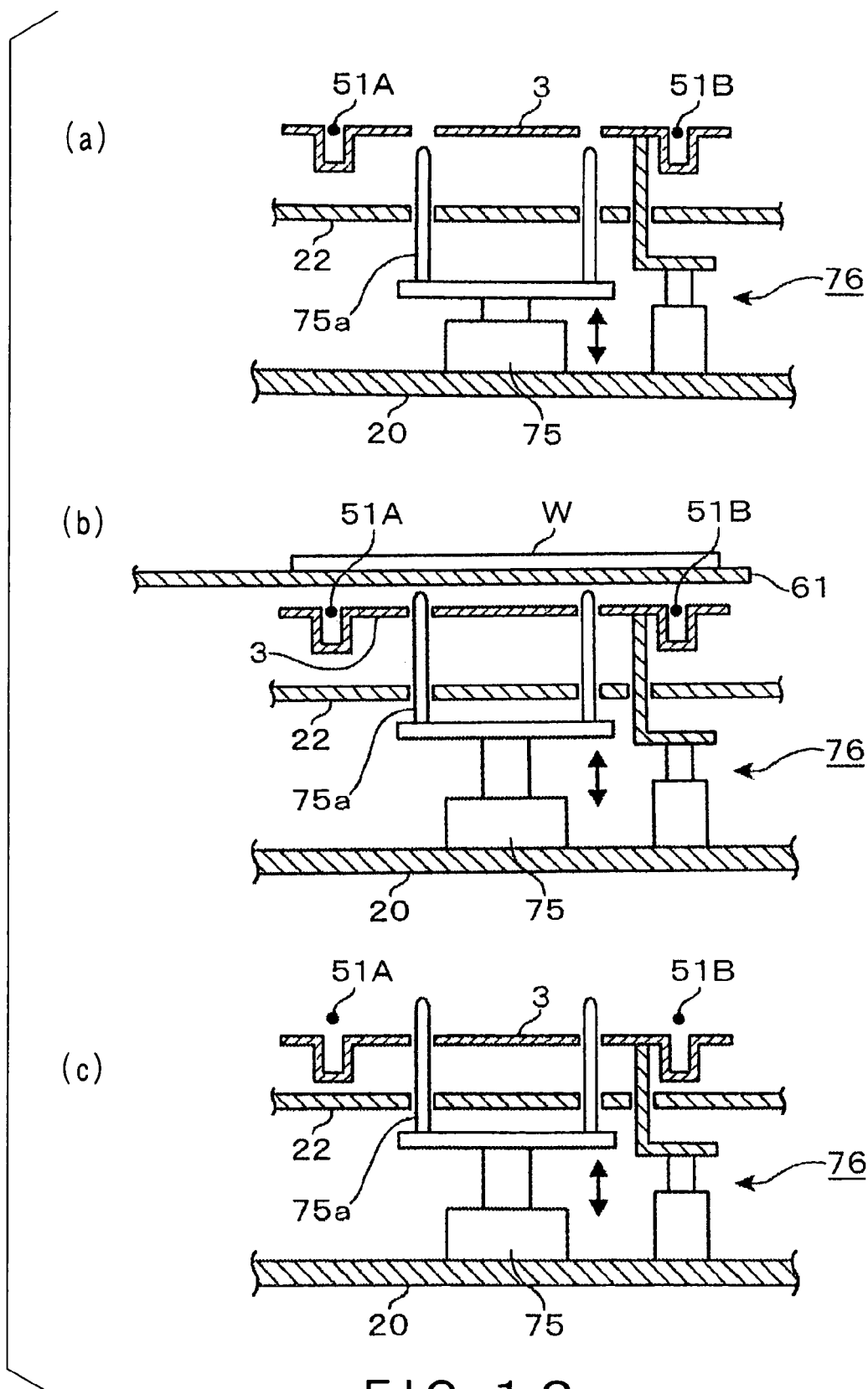
FIGS. 12(a), 12(b) and 12(c) are cross-sections showing still another example of the heating apparatus according to the present invention, respectively.

The transfer of the wafer W between the cooling plate 3 and the carrying mechanism 6 may be performed, as shown in FIGS. 12(*a*) and 12(*b*), using a lifting mechanism 75 including supporting pins 75*a* which can be optionally raised and lowered, such that the supporting pins 75*a* can be projected from and retracted in the surface of the cooling plate 3 without driving the wires 51 or the holding portions 72 to project from the surface of the cooling plate 3. It is noted that reference numeral 76 in FIGS. 12 denotes a lifting mechanism for the cooling plate 3.

In this case, when the carrying means 5 is located at the home position, as long as the members for holding the wafer W on the carrying means 5, for example, the wires 51 or holding portions 72 of the arm plate 7 and the supporting pins 75*a* do not interfere with each other, the transfer of the wafer W between the carrying mechanism 6 and the wires 51 or arm plate 7 may be performed directly, as shown in FIG. 12(*c*), by driving the supporting pins 75*a* to project from or retract in relative to the wires 51 or arm plate 7 while locating the cooling plate 3 below the wires 51 or holding portions 72.

Alternatively, in the case where the transfer of the wafer W between the cooling plate 3 and the external carrying mechanism 6 is performed by the lifting mechanism 75 including the supporting pins 75*a*, a carrying means including a thin-plate member adapted to hold the entire back face of the wafer W may be employed.

Figure 13:
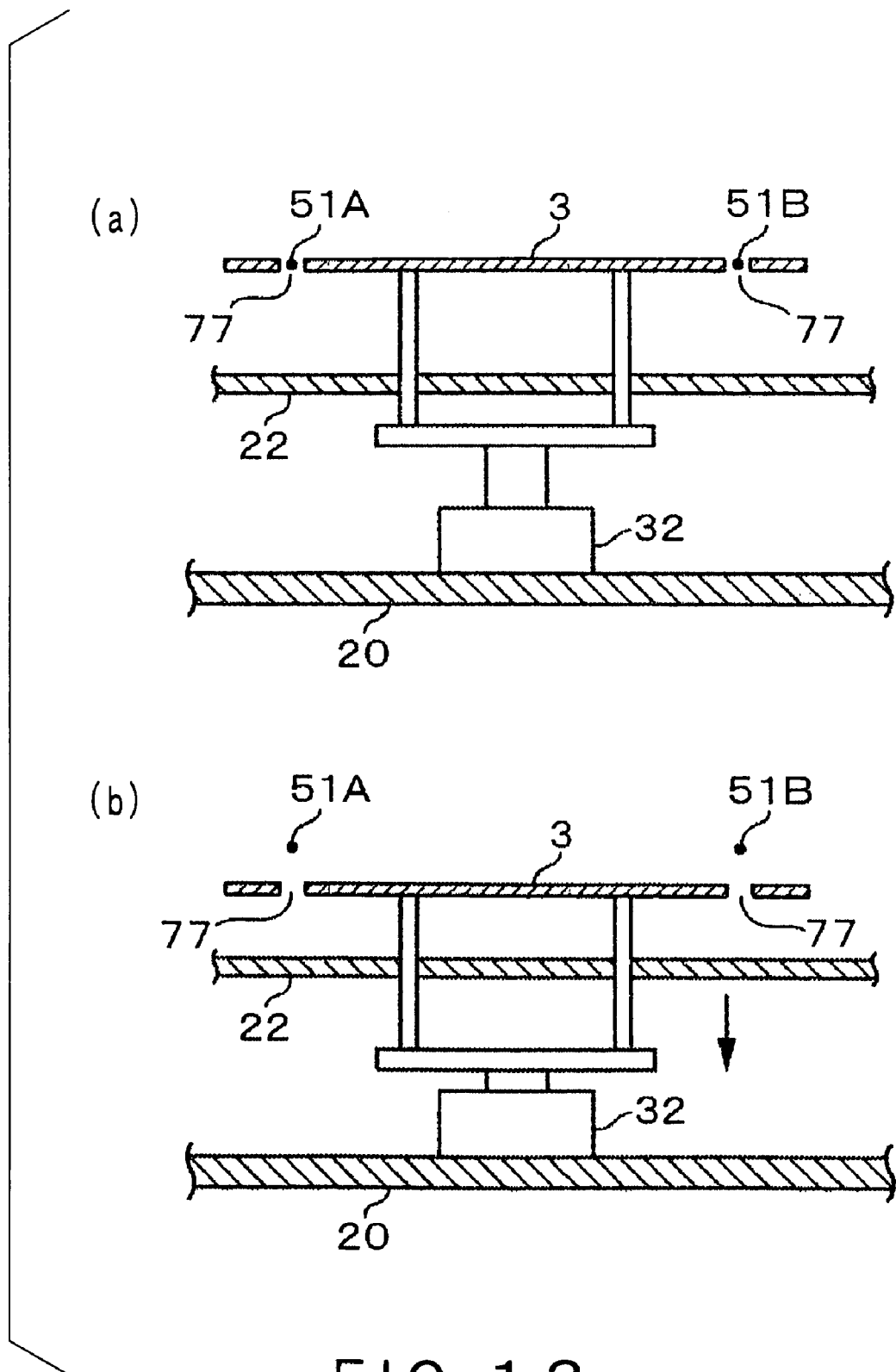
FIGS. 13(a) and 13(b) are cross-sections showing still another example of the heating apparatus according to the present invention, respectively.

Rather than providing the grooves 31, 70 in the cooling plate 3, apertures 77 through which the wires 51 or holding portions 71 can pass may be provided in the cooling plate 3 as shown in FIG. 13, such that the wires 51 or holding portions 72 can be raised and lowered relative to the cooling plate 3 through the apertures 77 to perform the transfer of the wafer W between the cooling plate 3 and the carrying means 5.

Further, in the heating apparatus of the present invention, the heating plate may be provided on either of the upper and lower sides of the heating chamber 4. The present invention can also be applied to a heating apparatus which includes a cooling plate and a heating plate, other than the heating apparatus for forming an air current flowing in one direction, and can be adapted to carry the wafer W therebetween.

Figure 14:
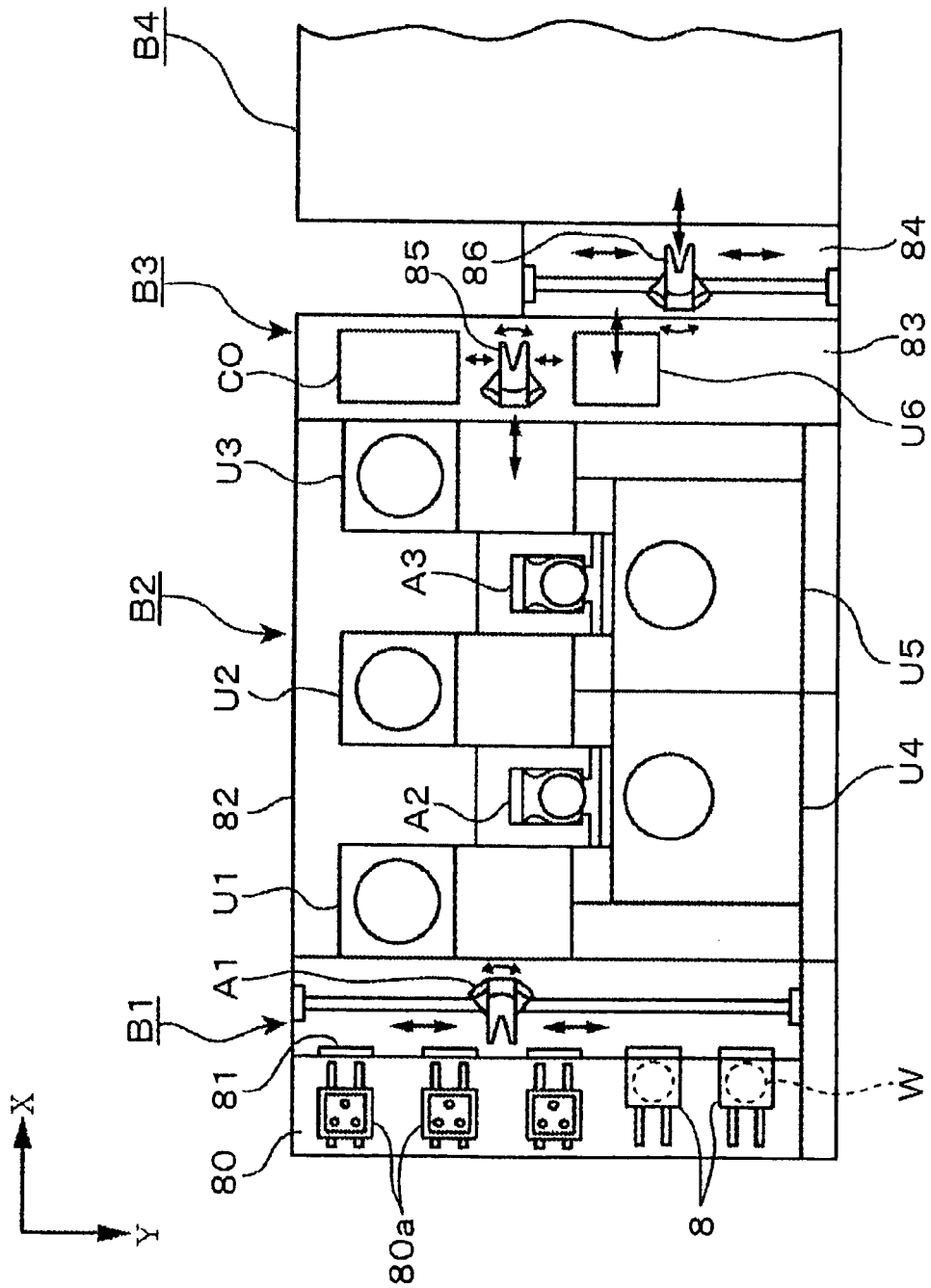
FIG. 14 is a plan view showing an example of a resist pattern forming apparatus in which the heating apparatus is incorporated.

Next, a general construction of a resist pattern forming system in which an exposing unit (exposing apparatus) is connected to a coating and developing apparatus incorporating a coating machine will be described briefly with reference to FIGS. 14 and 15. In the drawing, reference character B1 denotes a carrier placing unit for carrying-in and carrying-out carriers 8 in each of which, for example, 13 pieces, of substrates or wafers W are sealed and stored. The carrier placing unit B1 comprises a carrier station 80 on which a plurality of placing portions 80*a* for the carriers 8 can be arranged, opening and closing portions 81 provided at a wall located on the front side when viewed from the carrier station 80, and a transfer mean A1 for taking out the wafer W from each carrier 8 via the corresponding opening and closing portion 81.

On the back side of the carrier placing unit B1, a treatment unit B2 surrounded by a housing 82 is connected, in which rack units U1, U2, U3 composed of multi-staged heating and cooling units arranged in order from the front side, and main carrying means A2, A3 adapted to receive and transfer wafers W between these rack units U1 through U3 and liquid treating units U4, U5 are arranged alternately. Namely, the rack units U1, U2, U3 and the main carrying means A2, A3 are arranged in a line when viewed from the carrier placing unit B1, and at each connecting portion therebetween an opening (not shown) for carrying a wafer is provided, such that the wafer W can be moved freely in the treatment unit B2 from the rack unit U1 disposed at one end to the rack unit U3 at the other end.

Each of the rack units U1, U2, U3 is configured by stacking various units for performing pre-treatments and post-treatments for the treatments to be done by the liquid treating unit U4, U5, in plural stages, for example, in 10 stages. The combination of the units includes a receiving and transferring unit, a unit for treating an object to be hydrophobic (ADH), a temperature controlling unit for controlling the wafer W at a predetermined temperature (CPL), a heating unit for heating the wafer W before coating a resist liquid (BAKE), another heating unit, also referred to as a pre-baking unit or the like, for heating the wafer W after coating the resist liquid (PAB), still another heating unit, also referred to as a post-baking unit or the like, for heating the wafer W after a developing treatment (POST), and the like.

Figure 15:
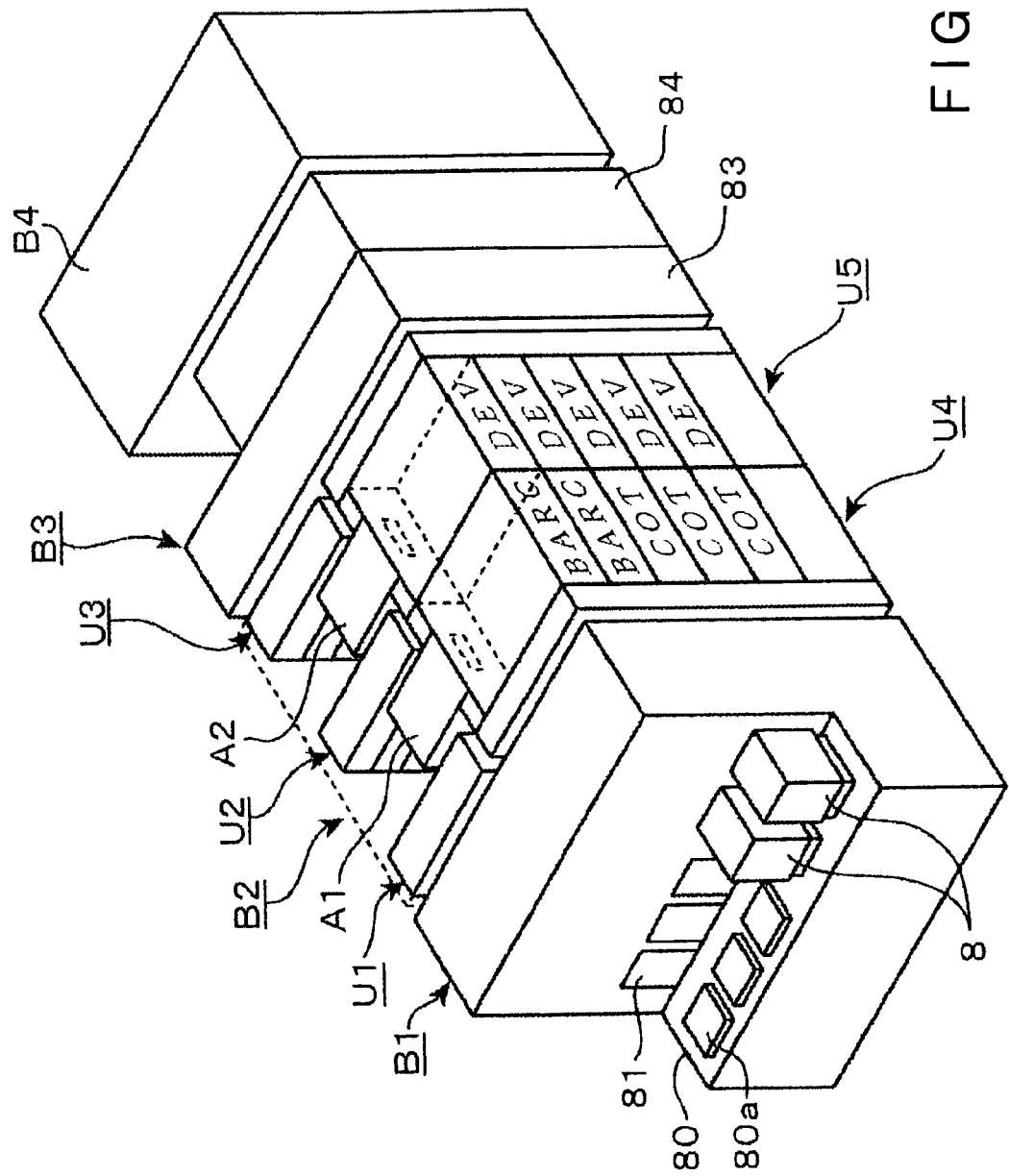
FIG. 15 is a perspective view showing an example of the resist pattern forming apparatus.
Figure 16:
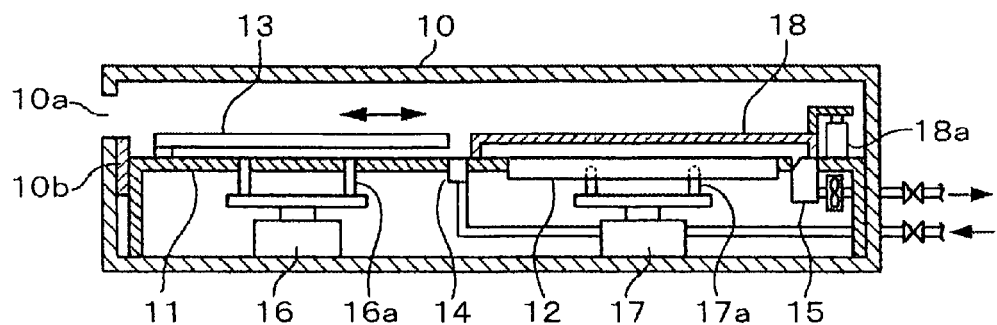
FIG. 16 is a cross-section showing a conventional heating apparatus.
Figure 17:
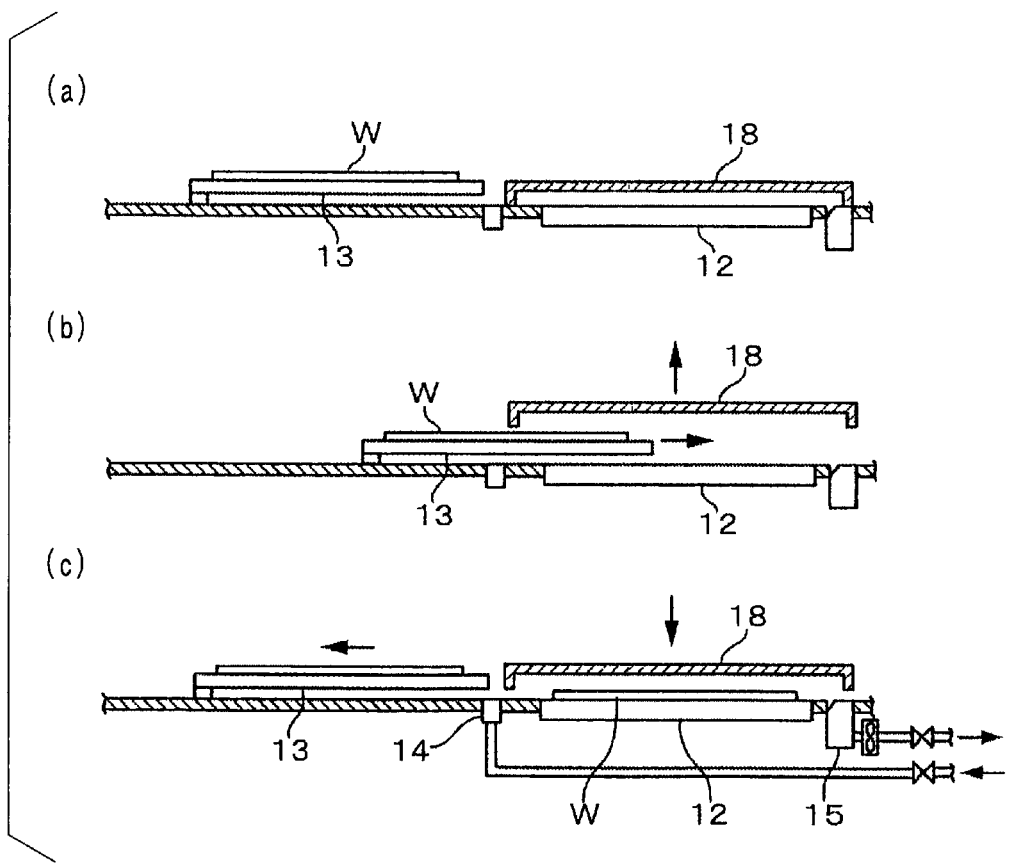
FIG. 17(a)(b)(c) are views illustrating a process of operation of the conventional heating apparatus.

For example, as shown in FIG. 15, each of the liquid treatment units U4, U5 is configured by stacking an antireflection film coating unit (BARC), a coating unit for coating a resist liquid on the wafer W (COT), a developing unit for performing development by supplying a developing liquid to the wafer W (DEV), and the like, in plural stages, for example, 5 stages.

Further, on the back side of the rack unit U3 in the treating unit B2, an exposing unit B4 is connected via an interface B3. The interface B3 comprises a first carrying chamber 83 and a second carrying chamber 84 each provided between the treating unit B2 and the exposing unit B4. The first carrying chamber 83 and the second carrying chamber 84 include a first carrying arm 85 and a second carrying arm 86, respectively, wherein each carrying arm can be optionally raised and lowered, rotated about the vertical axis, as well as advanced and retracted. Furthermore, in the first carrying chamber 83, a rack unit U6 is provided, which is configured by stacking vertically, for example, a receiving and transferring unit, a high accuracy temperature controlling unit (CPL), a heating/cooling unit for post-exposure-baking the wafer W (PEB), and the like.

Now, one example of the flow of processing the wafer W in this resist pattern forming system will be described. The wafer W in the carrier 8 placed on the carrier placing unit B1 is carried along a route, starting from the temperature control unit (CPL), followed by the antireflection film coating unit (BARC), the heating unit (BARC), the temperature control unit (CPL), the coating unit (COT), the heating unit (PAB), and ended at the exposing unit B4 in which the wafer W is subjected to an exposing treatment. After the exposing treatment, the wafer W is further carried along a route of the carrier 8, starting from the heating unit (PEB), followed by the high accuracy temperature control unit (CPL), the developing unit (DEV), the heating unit (POST), the temperature unit (CPL), and then ended at the carrier placing unit B1.

The present invention can also be applied to the post-exposure-baking (PEB) and the heating after the developing treatment, other than the heating (baking) of the wafer W after coated with a resist liquid. In addition, the present invention can be applied to treatments for LCD substrates, mask substrates or the like, other than those for the semiconductor wafers W.

The invention claimed is:

1. A heating apparatus, comprising:
 a treatment chamber;
 a flat heating chamber provided in the treatment chamber, with its one side opening for carrying in and carrying out a substrate;
 a heating plate disposed on the heating chamber;
 a cooling plate provided in the treatment chamber such located in the vicinity of the opening of the heating chamber and which cools the substrate which has been heated by the heating plate; and
 a carrying unit provided in the treatment chamber and which carries the substrate such that a heat treatment for the substrate can be performed for the substrate being held by the carrying unit in the heating chamber,
 wherein the flat heating chamber accommodates the substrate in a horizontal manner, the cooling plate supports the substrate in a horizontal manner, and the carrying unit carries the substrate along a carrying route extending in a horizontal direction between an upper position of the cooling plate and the interior of the heating chamber, and
 wherein the carrying unit comprises a plurality of wires extending in a direction crossing the carrying route for the substrate and which carries the substrate while holding it thereon.

2. The heating apparatus according to claim 1, wherein the carrying unit further comprises wire supporting portions which support both ends of the wires, and a moving mechanism which moves the wire supporting portions such that the substrate can be carried along the carrying route extending in the horizontal direction between the upper position of the cooling plate and the interior of the heating chamber.

3. The heating apparatus according to claim 1, wherein grooves are formed in the cooling plate such that the wires can get therein, and wherein the substrate on the wires can be transferred to the cooling plate by raising the cooling plate, using a lifting apparatus, relative to the wires to drive the wires to get in the grooves, while the substrate on the cooling plate can be transferred to the wires by driving the wires to get out upward from the grooves.

4. The heating apparatus according to claim 2, wherein grooves are formed in the cooling plate such that the wires can get therein, and wherein the substrate on the wires can be transferred to the cooling plate by raising the cooling plate, using a lifting apparatus, relative to the wires to drive the wires to get in the grooves, while the substrate on the cooling plate can be transferred to the wires by driving the wires to get out upward from the grooves.

5. A heating apparatus comprising:
 a treatment chamber;
 a flat heating chamber provided in the treatment chamber, with its one side opening for carrying in and carrying out a substrate;
 a heating plate disposed on the heating chamber;
 a cooling plate provided in the treatment chamber such located in the vicinity of the opening of the heating chamber and which cools the substrate which has been heated by the heating plate; and
 a carrying unit provided in the treatment chamber and which carries the substrate such that a heat treatment for the substrate can be performed for the substrate being held by the carrying unit in the heating chamber,
 wherein the flat heating chamber accommodates the substrate in a horizontal manner, the cooling plate supports the substrate in a horizontal manner, and the carrying unit carries the substrate along a carrying route extending in a horizontal direction between an upper position of the cooling plate and the interior of the heating chamber,
 wherein the carrying unit includes a thin plate member which holds the periphery of the substrate, and
 wherein the thin plate member includes a plate member having an inner peripheral face extending along a part of the periphery of the substrate, and a plurality of holding portions projecting inward from the plate member and which holds a part of the periphery on the back face side of the substrate.

6. The heating apparatus according to claim 5, wherein grooves are formed in the cooling plate such that the holding portions can get therein, and wherein the substrate on the holding portions can be transferred to the cooling plate by raising the cooling plate, using a lifting apparatus, relative to the holding portions to drive the holding portions to get in the grooves, while the substrate on the cooling plate can be transferred to the holding portions by driving the holding portions to get out upward from the grooves.

7. The heating apparatus according to claim 1 or 5, wherein cooling plate notched portions corresponding to the shape of an external carrying mechanism are formed in the periphery of the cooling plate, and wherein when the substrate is transferred from the external carrying mechanism holding the substrate placed thereon to the cooling plate, the external carrying mechanism holding the substrate placed thereon is advanced over the cooling plate, passes through the cooling plate from above to below through the cooling plate notched portions so as to transfer the substrate to the cooling plate, and then retracts from between the cooling plate and the carrying unit.

8. The heating apparatus according to claim 1 or 5, wherein the height in the vertical direction of the opening formed on one side of the heating apparatus for carrying in and carrying out the substrate is 6 mm or less.

* * * * *